(12) United States Patent
Todorokihara

(10) Patent No.: US 9,231,613 B2
(45) Date of Patent: Jan. 5, 2016

(54) IDLE TONE DISPERSION DEVICE AND FREQUENCY MEASUREMENT DEVICE

(71) Applicant: Seiko Epson Corporation, Tokyo (JP)

(72) Inventor: Masayoshi Todorokihara, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/712,087

(22) Filed: May 14, 2015

(65) Prior Publication Data

US 2015/0333765 A1    Nov. 19, 2015

(30) Foreign Application Priority Data

May 15, 2014    (JP) ................................. 2014-101818

(51) Int. Cl.
*H03M 3/00*    (2006.01)

(52) U.S. Cl.
CPC ............... *H03M 3/346* (2013.01); *H03M 3/30* (2013.01); *H03M 3/396* (2013.01); *H03M 3/472* (2013.01)

(58) Field of Classification Search
CPC ....... H03M 3/346; H03M 3/472; H03M 3/30; H03M 3/396
USPC ......................................................... 341/143
See application file for complete search history.

(56) References Cited

U.S. PATENT DOCUMENTS

| | | | |
|---|---|---|---|
| 6,219,394 B1 | 4/2001 | Sander | |
| 6,326,911 B1 * | 12/2001 | Gomez et al. | 341/143 |
| 6,362,769 B1 | 3/2002 | Hovin et al. | |
| 6,710,729 B1 * | 3/2004 | Chen | 341/143 |
| 7,027,545 B2 | 4/2006 | Sander | |
| 7,064,698 B2 * | 6/2006 | Locher et al. | 341/143 |
| 8,339,297 B2 * | 12/2012 | Lindemann et al. | 341/131 |
| 2009/0232339 A1 | 9/2009 | Motobayashi et al. | |

FOREIGN PATENT DOCUMENTS

JP    2009-218860 A    9/2009

OTHER PUBLICATIONS

Dag T. Wisland et al., "A Novel Multi-Bit Parallel ΔΣ FM-To-Digital Converter with 24-Bit Resolution", Department of Informatics, University of Oslo, Norway, 2002, pp. 687-690.

Richard Schreier et al., "Understanding Delta-Sigma Data Converters", Published by John Wiley & Sons, Inc., Hoboken, New Jersey, 2005, pp. 32-41 (with English translation).

* cited by examiner

*Primary Examiner* — Brian Young
(74) *Attorney, Agent, or Firm* — Harness, Dickey & Pierce, P.L.C.

(57) ABSTRACT

An idle tone dispersion device includes n FDSM (1) to FDSM (n), a phase adjustment unit which relatively adjusts a phase between a measured signal and a reference signal such that a phase of an idle tone is completely different, and generates and supplies n sets of output measured signals and output reference signals to each of the n FDSM (1) to FDSM (n), and an adder which adds output data of the n FDSM (1) to FDSM (n) and outputs a frequency delta-sigma modulation signal.

13 Claims, 28 Drawing Sheets

| Fcj | PROGRESS IN CYCLE OF Fxj |
|---|---|
| 0 | 0 |
| 1 | $3 + \frac{1}{7}$ |
| 2 | $6 + \frac{2}{7}$ |
| 3 | $9 + \frac{3}{7}$ |
| 4 | $12 + \frac{4}{7}$ |
| 5 | $15 + \frac{5}{7}$ |
| 6 | $18 + \frac{6}{7}$ |
| 7 | $22 + \frac{0}{7}$ |
| 8 | $25 + \frac{1}{7}$ |
| ⋮ | ⋮ |

IDLE TONE DISPERSION DEVICE AND FREQUENCY MEASUREMENT DEVICE

BACKGROUND

1. Technical Field

The present invention relates to an idle tone dispersion device improving the resolution of a frequency digital signal conversion, and a frequency measurement device.

2. Related Art

As a method of converting an analog signal into a digital signal, a delta-sigma modulation method is known. In addition, in U.S. Pat. No. 6,362,769, a frequency measurement device is disclosed in which a frequency of a measured signal is measured by using the delta-sigma modulation method. Further, in U.S. Pat. No. 6,362,769, it is disclosed that a continuous output of a count value of a configuration without having a dead period corresponds to a first delta-sigma modulation signal corresponding to the level of the frequency of the measured signal in the frequency measurement device. In the following description, a converter for specifying the frequency of the measured signal by converting the measured signal by the delta-sigma modulation method using a reference signal is referred to as a Frequency Delta Sigma Modulator (FDSM).

In general, it is known that a cyclic quantization noise referred to as an idle tone occurs in an output of a delta-sigma modulator (for example, refer to Chapter 2.6 in Richartd Schreier, Gabor C. Temes.; Introduction to $\Delta\Sigma$ Type Analog/Digital Converter, pages 34 to 41, 2007). The idle tone is a noise directly connected to a degradation in measurement accuracy in frequency measurement using FDSM.

In Dag T Wisland, et al., ESSCIRC2002, pp. 687-690, 2002, a method is considered in which the measured signal is sequentially delayed and is supplied to a plurality of parallelized FDSMs, and the reference signal is supplied to the entire FDSM, and an output of a plurality of parallelized FDSMs is added, and thus the idle tone is suppressed.

However, when a frequency modulation signal is input into FDSM as the measured signal, a quantization noise component in the output of FDSM is overlapped with a baseband signal component of the measured signal. The frequency measurement device in Dag T Wisland, et al., ESSCIRC2002, pp. 687-690, 2002 is premised on the fact that even when the measured signal which is delayed is input into FDSM, the baseband signal component included in the output is not changed, but the quantization noise component included in the output is not correlated at the time of being compared between parallel outputs. Then, in order to minimize a circuit scale, when a configuration of FDSM is limited to be a bit stream output, and then the frequency of the measured signal is lower than a frequency of the reference signal, an effect of dispersing the quantization noise is maximized by designing each amount of delay to divide a half cycle of the measured signal.

However, in Dag T Wisland, et al., ESSCIRC2002, pp. 687-690, 2002, it is also reported that an expected improvement is not obtained in experiment verification.

SUMMARY

An advantage of some aspects of the invention is to suppress the idle tone which is the cyclic quantization noise occurring in a delta-sigma modulation.

An aspect of the invention is directed to an idle tone dispersion device which performs a frequency delta-sigma modulation with respect to a measured signal by using a reference signal and outputs a frequency delta-sigma modulation signal having an idle tone dispersed therein, including n frequency delta-sigma modulation units (modulators); a phase adjustment unit (adjuster) which relatively adjusts a phase between the measured signal and the reference signal, generates n sets of (n is a natural number greater than or equal to 2) output measured signals and output reference signals, and supplies each set of output measured signals and output reference signals to each of the n frequency delta-sigma modulation units; and an adding unit (an adder) which adds an output signal of the n frequency delta-sigma modulation units and outputs the frequency delta-sigma modulation signal, in which each of the n frequency delta-sigma modulation units performs the frequency delta-sigma modulation with respect to the output measured signal by using the output reference signal supplied from the phase adjustment unit, and the phase adjustment unit relatively adjusts the phase between the measured signal and the reference signal such that an entire phase of the idle tone is different from the output signal of the n frequency delta-sigma modulation units, and generates the n sets of output measured signals and output reference signals.

A quantization noise due to an idle tone is overlapped with the output signal of the frequency delta-sigma modulation unit. In this case, the phase between the measured signal and the reference signal is relatively adjusted such that the entire phase of the idle tone is different from the output signal of the n frequency delta-sigma modulation units, and thus it is possible to suppress the quantization noise due to the idle tone by adding the output signal of the n frequency delta-sigma modulation units.

Here, "relatively adjusting the phase between the measured signal and the reference signal" includes an aspect of delaying only the measured signal, an aspect of delaying only the reference signal, and an aspect of delaying the measured signal and the reference signal.

In the idle tone dispersion device according to the aspect described above, it is preferable that, when a predetermined time is D, one cycle of the measured signal or one cycle of the reference signal is T, m is a natural number less than or equal to n, mD/nT is an integer, mD/nT and m are coprime integers, and a phase difference between the output measured signal and the output reference signal supplied to an i-th (i is a natural number less than or equal to n−11) frequency delta-sigma modulation unit is Pi, the phase adjustment unit relatively adjusts the phase between the measured signal and the reference signal such that D/n=Pi+1−Pi, and generates the n sets of output measured signals and output reference signals.

When mD/nT is an integer, mD/nT and m are not coprime integers, and the greatest common factor of mD/nT and m is g, a cycle circulating m/g times occurs in a dispersion of a phase relationship of the idle tone. In this case, the phase adjustment unit sets the predetermined time D such that mD/nT and m are coprime integers, and thus it is possible to reliably disperse the idle tone. As a result thereof, it is possible to improve SNR of the frequency delta-sigma modulation signal.

In the idle tone dispersion device according to the aspect described above, it is preferable that the frequency delta-sigma modulation unit outputs the output signal in a data stream format, and when a shorter cycle between one cycle of the measured signal and one cycle of the reference signal is Tx, and a phase difference between the output measured signal and the output reference signal supplied to an i-th (i is a natural number less than or equal to n−1) frequency delta-sigma modulation unit is Pi, the phase adjustment unit relatively adjusts the phase between the measured signal and the reference signal such that Tx/n=Pi+1−Pi, and generates the n sets of output measured signals and output reference signals.

A quantization error due to the idle tone is overlapped with the output signal of the frequency delta-sigma modulation unit which is generated in the data stream format. In this case, a cycle of the idle tone is determined according to the frequency (the cycle) of the measured signal and the frequency (the cycle) of the reference signal, but the cycle is not below the shorter cycle between the one cycle of the measured signal and the one cycle of the reference signal. In this case, when the phase difference between the output measured signal and the output reference signal supplied to the i-th frequency delta-sigma modulation unit is Pi, and the shorter cycle is Tx, the phase adjustment unit relatively adjusts the phase between the measured signal and the reference signal such that Tx/n=Pi+1−Pi, and thus the phase of the idle tone which is overlapped with the output signal output from the n frequency delta-sigma modulation units is shifted by Tx/n. Accordingly, the idle tone which is overlapped with n output signals is temporally dispersed, and thus the quantization noise due to the idle tone which is overlapped with frequency delta-sigma modulation signal is suppressed, and SNR is improved.

In the idle tone dispersion device according to the aspect described above, it is preferable that the frequency delta-sigma modulation unit outputs the output signal in a bit stream format, and when a shorter cycle between a half cycle of the measured signal and one cycle of the reference signal is Tx, and a phase difference between the output measured signal and the output reference signal supplied to an i-th (i is a natural number less than or equal to n−1) frequency delta-sigma modulation unit is Pi, the phase adjustment unit relatively adjusts the phase between the measured signal and the reference signal such that Tx/n=Pi+1−Pi, and generates the n sets of output measured signals and output reference signals.

The quantization error due to the idle tone is overlapped with the output signal of the frequency delta-sigma modulation unit which is generated in the bit stream format. In this case, the cycle of the idle tone is determined according to the frequency (the cycle) of the measured signal and the frequency (the cycle) of the reference signal, but the cycle is not below the shorter cycle between the half cycle of the measured signal and the one cycle of the reference signal. In this case, when the phase difference between the output measured signal and the output reference signal supplied to the i-th frequency delta-sigma modulation unit is Pi, and the shorter cycle between the half cycle of the measured signal and the one cycle of the reference signal is Tx, the phase adjustment unit relatively adjusts the phase between the measured signal and the reference signal such that Tx/n=Pi+1−Pi, and thus the phase of the idle tone which is overlapped with the output signal output from the n frequency delta-sigma modulation units is shifted by Tx/n. Accordingly, the idle tone which is overlapped with the n output signals is temporally dispersed, and thus the quantization noise due to the idle tone which is overlapped with the frequency delta-sigma modulation signal is suppressed, and SNR is improved.

In the idle tone dispersion device according to the aspect described above, it is preferable that the phase adjustment unit includes a plurality of delay circuits connected in series of which each delay time is Tx/n, and one signal between the measured signal and the reference signal is supplied to the n frequency delta-sigma modulation units, and the other signal between the measured signal and the reference signal is delayed by using the plurality of delay circuits and is supplied to the n frequency delta-sigma modulation unit.

According to this configuration, the phase adjustment unit relatively adjusts the phase between the measured signal and the reference signal by the plurality of delay circuits, and the delay time of each of the delay circuits is set to Tx/n, and thus it is possible to minimize the number of delay circuits and a total delay time of the plurality of delay circuits. Accordingly, it is possible to simplify a configuration of the idle tone dispersion device.

In the idle tone dispersion device according to the aspect described above, it is preferable that a comparison unit (comparator) which compares a frequency of the measured signal with a frequency of the reference signal is further included, and the phase adjustment unit relatively adjusts the phase between the measured signal and the reference signal on the basis of a comparison result of the comparison unit, and generates the n sets of output measured signals and output reference signals.

In this case, the phase adjustment unit relatively adjusts the phase between the measured signal and the reference signal on the basis of the comparison result of the comparison unit, and thus even when it is unclear which one is the shorter cycle between the one cycle or the half cycle of the measured signal and the one cycle of the reference signal, the idle tone which is overlapped with the n output signals is temporally dispersed, and it is possible to suppress the quantization noise due to the idle tone which is overlapped with the frequency delta-sigma modulation signal.

Another aspect of the invention is directed to a frequency measurement device including the idle tone dispersion device described above; and a frequency data generating unit (generator) which generates frequency data indicating a frequency of a measured signal on the basis of a frequency delta-sigma modulation signal. In this case, the frequency data is generated on the basis of the frequency delta-sigma modulation signal in which the quantization noise due to the idle tone is suppressed, and thus it is possible to improve measurement accuracy of the frequency.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, embodiments of the invention will be described with reference to the drawings.

1. First Embodiment 1-1: Overall Configuration

Figure 1:
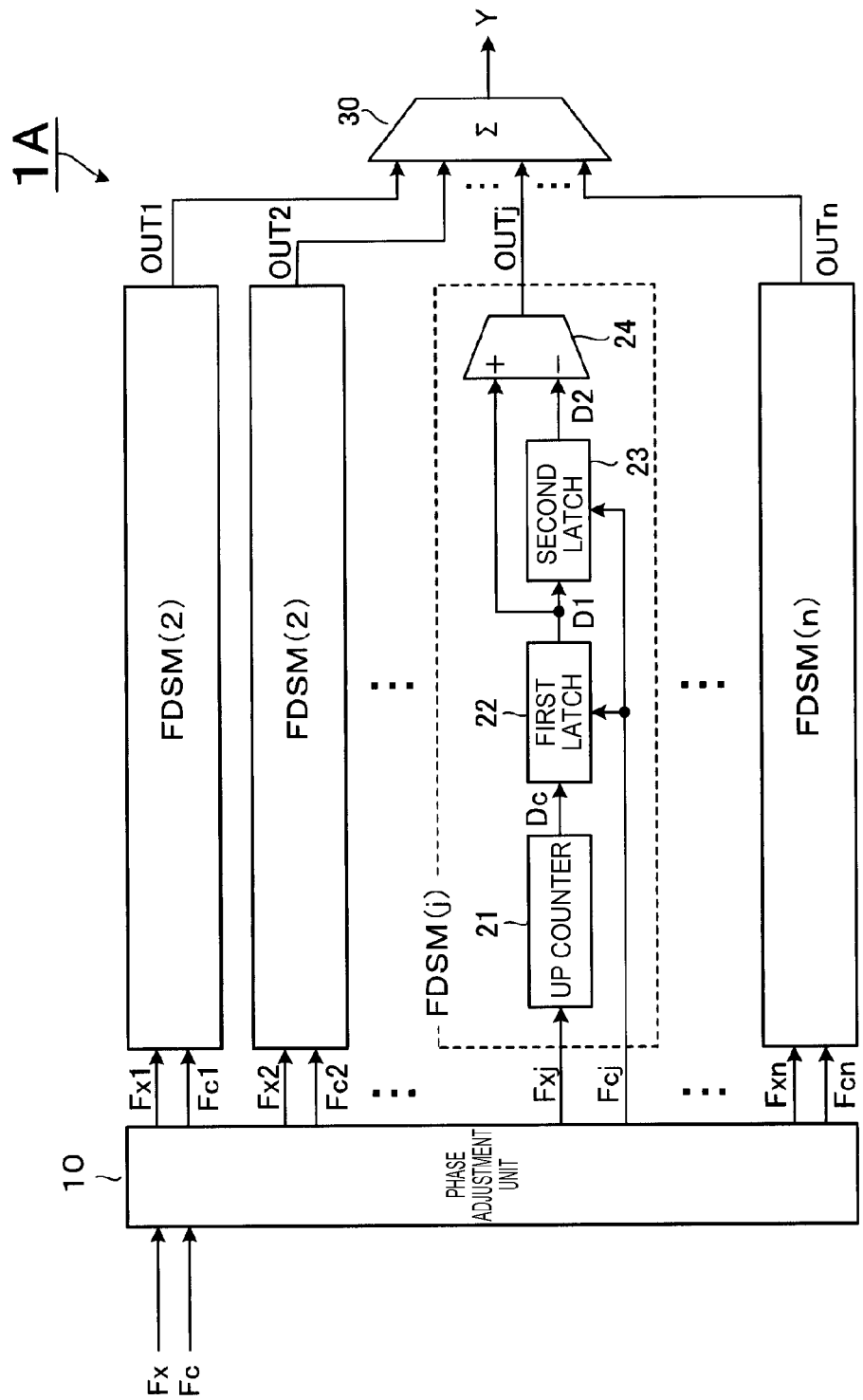
FIG. 1 is a block diagram of an idle tone dispersion device according to a first embodiment.

In FIG. 1, a block diagram of an idle tone dispersion device according to a first embodiment is illustrated. As illustrated in this drawing, an idle tone dispersion device 1A includes a phase adjustment unit 10 which adjusts a phase of a measured signal Fx and a reference signal Fc, and outputs n (n is a natural number greater than or equal to 2) sets of output measured signals Fx1 to Fxn and output reference signals Fc1 to Fcn, parallelized n FDSM (1) to FDSM (n), and an adder 30.

A j-th (j is a natural number greater than or equal to 1 and less than or equal to n) FDSM (j) performs a frequency delta-sigma modulation with respect to an output measured signal Fxj by using an output reference signal Fcj, and generates output data OUTj. The adder 30 adds the output data OUT1 to OUTn, and generates a frequency delta-sigma modulation signal Y.

FDSM (j) includes an up counter 21 which counts a rising edge of the output measured signal Fxj, and outputs count data Dc indicating a count value, a first latch 22 which latches the count data Dc in synchronization with the rising edge of the output reference signal Fcj, and outputs first data D1, a second latch 23 which latches the first data D1 in synchronization with the rising edge of the output reference signal Fcj, and outputs second data D2, and a subtractor 24 which subtracts the second data D2 from the first data D1, and generates the output data OUTj. FDSM (1) to FDSM (j−1), and FDSM (j+1) to FDSM (n) have the same configuration as that of FDSM (j).

FDSM (j) of this example is referred to as a first frequency delta-sigma modulator, the count value of the output measured signal Fxj is latched two times by the output reference signal Fcj, and sequentially maintains the count value of the output measured signal Fxj by using the rising edge of the output reference signal Fcj as a trigger. In this example, a case is assumed in which a latch operation is performed at the rising edge, and the latch operation may be performed at a falling edge. In addition, the subtractor 24 calculates a difference between two count values which are maintained, and thus outputs an increase in the count value of the output measured signal Fxj which is observed while the output reference signal Fcj transitions for one cycle over time without having a dead period. When a frequency of the measured signal Fx is fx, and a frequency of the reference signal Fc is fc, a frequency ratio is fx/fc. FDSM (j) outputs the frequency ratio as a digital signal array. The output data OUTj output from FDSM (j) includes a quantization error.

When the digital signal array is indicated by a data array and data stream, and one bit, the digital signal array is particularly referred to as a bit array and bit stream, or the like. The idle tone dispersion device 1A of the first embodiment corresponds to a data stream. An idle tone dispersion device corresponding to a bit stream will be described in a second embodiment.

1-2: Relationship between Frequency Delta-Sigma Modulation and Idle Tone

Next, a relationship between the frequency delta-sigma modulation and an idle tone will be described. As the measured signal Fx, a signal (47.619047 kHz) at one cycle of 21 μS is considered. In addition, as the reference signal Fc, a signal (15.15 kHz) at one cycle of 66 μS is considered. This corresponds to a case where the frequency fx of the measured signal Fx is higher than the frequency fc of the reference signal Fc. A ratio of fx and fc is denoted by the following expression.

$$fx{:}fc = 1/21e^{-6} : 1/66e^{-6} = 22{:}7$$

In this case, a time of 22 cycles of the measured signal Fx is identical to a time of 7 cycles of the reference signal Fc. That is, the same data array is repeated for each 21 μS×22=66 μS×7=462 μS.

Figure 2:
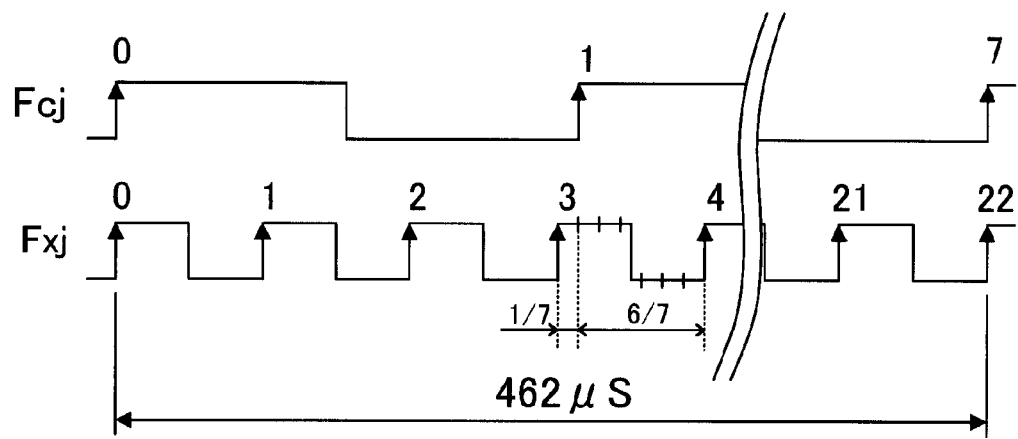
FIG. 2 is a timing chart illustrating an example of an output reference signal and an output measured signal.

When an operation of FDSM (j) at this time is considered, the output measured signal Fxj progresses by 22/7 cycles=3+1/7 cycles while the output reference signal Fcj progresses for one cycle, and the count value is increased by 3 or 4. Accordingly, 3 or 4 is output from the subtractor 24 over time. FIG. 2 illustrates such a relationship by using a case where the rising edge of the output reference signal Fcj is identical to the rising edge of the output measured signal Fxj as an origination. FIG. 2 illustrates that the rising edges are identical to each other again after 462 μS from the moment when the rising edge of the output reference signal Fcj is identical to the rising edge of the output measured signal Fxj. In general, even when a case where the rising edge of the output reference signal Fcj is not identical to the rising edge of the output measured signal Fxj is used as an origination, a pulse array corresponding to a phase shift is repeated for a cycle of 462 μS, and for the sake of simplicity, the case where the moment when the rising edge of the output reference signal Fcj is identical to the rising edge of the output measured signal Fxj is used as an origination is described herein.

Figure 3:
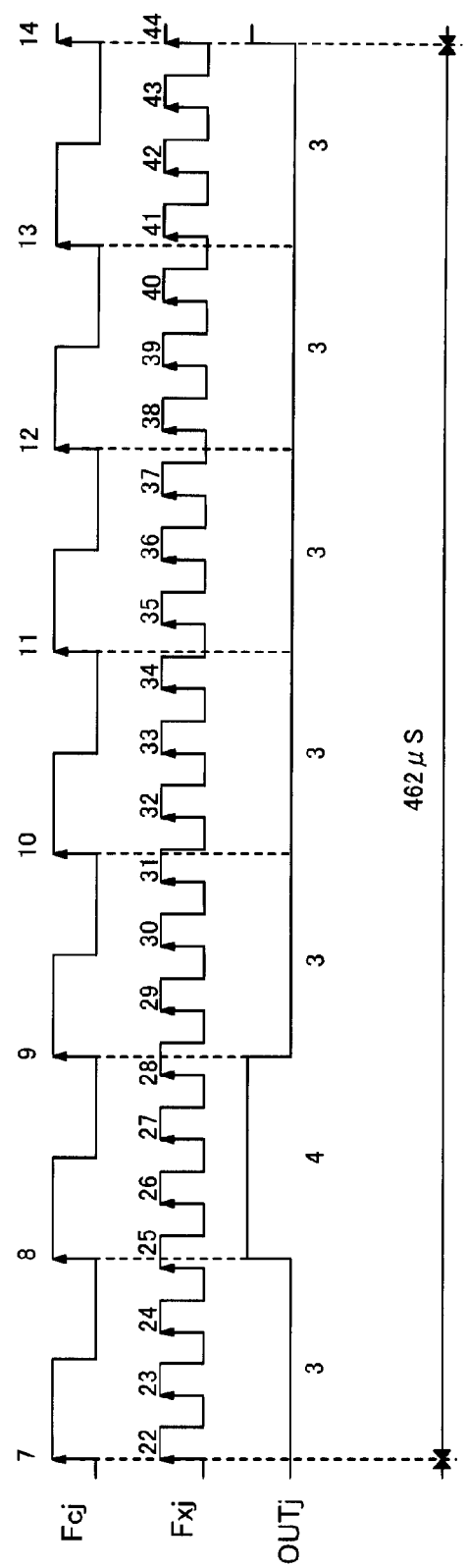
FIG. 3 is a timing chart illustrating an example of output data.

In a data array of the output data OUTj of actual FDSM (j), a repeated pattern of "3433333" as illustrated in FIG. 3 appears at a cycle of 462 μS. Furthermore, FDSM (j) of FIG. 1 has an indeterminate output of the first latch 22 and the second latch 23 at the time of initiating the operation, and FIG. 3 illustrates a repeated pattern of the next second circulation in which the cycle of initial 462 μS is circulated. It is easily understood that the repeated pattern at the cycle of 462 μS considers a progress of the cycle of the output measured signal Fxj illustrated in FIG. 4. In a case of this example, it is indicated that the output measured signal Fxj progresses by 3+1/7 cycles while the output reference signal Fcj progresses for an initial one cycle, and when focusing on a 4-th cycle of the output measured signal Fxj, the output measured signal Fxj progresses by 1/7 cycles based on an end of a 3-rd cycle of the output measured signal Fxj. Such a non-integer appears because a value of a frequency ratio or a cycle ratio between the output measured signal Fxj and the output reference signal Fcj is not in an integer relationship, and thus a point at which the output measured signal Fxj progresses from the end of the 3-rd cycle of the output measured signal Fxj by 1/7 cycles is used as an origination of the phase of the output measured signal Fxj at a 2-nd cycle of the output reference signal Fcj. Then, in an end of the 2-nd cycle of the output reference signal Fcj, the output measured signal Fxj progresses by 6+2/7 cycles counted from the initial. In consideration of this, it is indicated that a non-integer of a number times of transition returns to 0 (a non-integer corresponding to the phase shift when a case where the rising edge of the output measured signal Fxj is not identical to the rising edge of the output reference signal Fcj is used as an origination) whenever the output reference signal Fcj progresses by 7 cycles. Regardless of the level of the output measured signal Fxj, a noise due to a frequency component in such a repeated pattern having cyclic properties is the idle tone.

The idle tone is generated inside FDSM (j) by the quantization error on the basis of a phase relationship between the output reference signal Fcj and the output measured signal Fxj. When the idle tone is not generated, a change in the output data OUTj of the FDSM (j) indicates a fluctuation or a variation in the output measured signal Fxj with respect to the output reference signal Fcj, and thus when an influence of the idle tone is ignored, the output data OUTj when a fluctuation or a variation in the output measured signal Fxj does not occur with respect to the output reference signal Fcj is able to be regarded as a direct current. In other words, the influence of the idle tone which is overlapped with the variation in the output measured signal Fxj with respect to the output reference signal Fcj appears in a change in the output data OUTj.

The idle tone is able to be excluded or lessened by performing a filtering treatment with respect to the output data OUTj of FDSM (j).

However, when a performance of a filter has a limitation, and the frequency fx of the output measured signal Fxj or a variation therein is unknown, it is not possible to determine a specification of the filter. Further, detection of a fluctuation component or a variation component of the output measured signal Fxj with respect to the output reference signal Fcj in a blocking region of the filter is also blocked. Accordingly, in a high accuracy measurement using FDSM, it is important to suppress the idle tone.

Figures 4, 5:
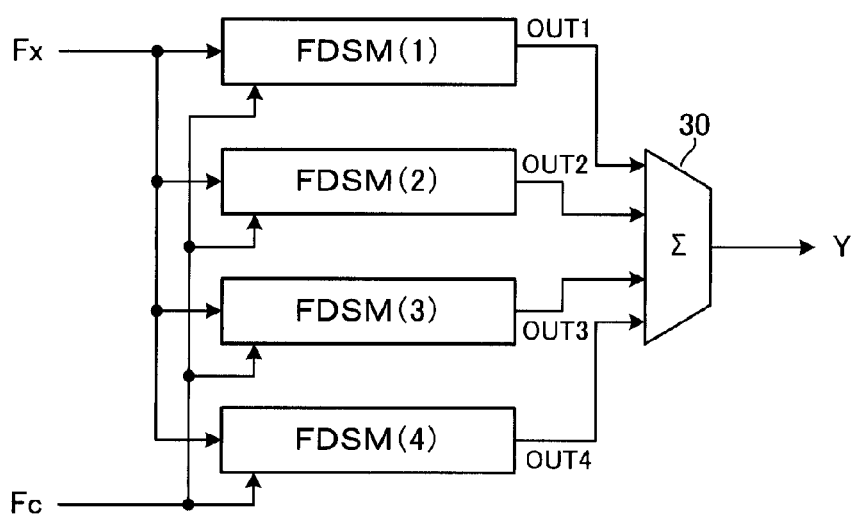
FIG. 4 is an explanatory diagram illustrating a progress of a cycle of the output measured signal.
FIG. 5 is a block diagram of a device in which FDSM is simply parallelized.

Next, the idle tone when FDSMs are connected in parallel will be considered. FIG. 5 is an example in which four FDSM (1) to FDSM (4) are simply parallelized, and the output data OUT1 to OUT4 are added. The device eliminates the phase adjustment unit 10 from the idle tone dispersion device 1A illustrated in FIG. 1, and directly supplies the measured signal Fx and the reference signal Fc to the four FDSM (1) to FDSM (4).

Figure 6:
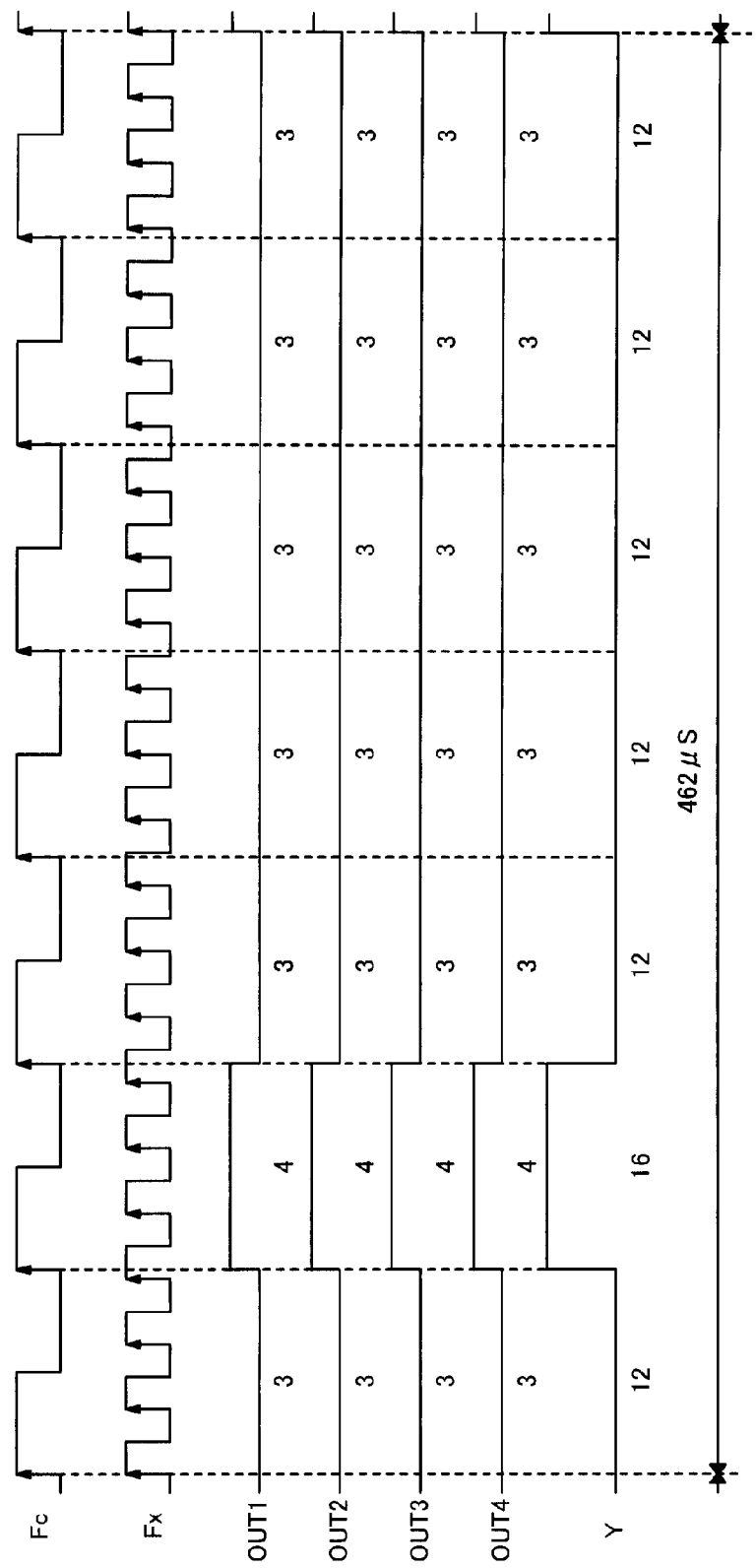
FIG. 6 is a timing chart of the device illustrated in FIG. 5.

Here, when the measured signal Fx is identical to the output measured signal Fxj illustrated in FIG. 2, and the reference signal Fc is identical to the output reference signal Fcj illustrated in FIG. 2, a timing chart of the device illustrated in FIG. 5 is illustrated in FIG. 6. When comparing FIG. 6 with FIG. 3, it is determined that even when the four FDSM (1) to FDSM (4) are parallelized, a repeated pattern of "3433333" of one FDSM (j) illustrated in FIG. 3 is merely changed to "12 16 12 12 12 12 12". That is, when an intensity of the frequency delta-sigma modulation signal Y is quadrupled, a quantization error is also quadrupled, and thus SNR of "3433333" is identical to SNR of "12 16 12 12 12 12 12". That is, it is indicated that an appearance of the influence of the idle tone is not changed only by simply connecting FDSMs in parallel. As it is clear from FIG. 6, the reason is because phase relationships of the idle tones among the outputs of FDSM (1) to FDSM (4) are identical to each other. Accordingly, not only in four parallel FDSMs but also in 5, 6, 7, . . . , and n parallel FDSMs, the appearance of the influence of the idle tone is not changed.

It is clear the phase of the idle tone is determined by the phase relationship between two signals input into FDSM. In addition, in order to disperse the phase relationship of the idle tone among the outputs of n parallel FDSMs, a relative position of a repeated pattern appearing in the output of each single FDSM configuring n parallel FDSMs may be shifted, and for this reason, a relative phase relationship in a parallel input is dispersed between the output measured signal and the output reference signal which are input into each FDSM.

1-3: Phase Adjustment Unit

In this embodiment, the phase adjustment unit 10 generates n sets of output measured signals and output reference signals (Fx1, Fc1), (Fx2, Fc2), . . . , and (Fxn, Fcn) by relatively adjusting the phase between the measured signal Fx and the reference signal Fc such that the entire phase of the idle tone of the output data OUT1 to OUTn is different.

Figure 7A:
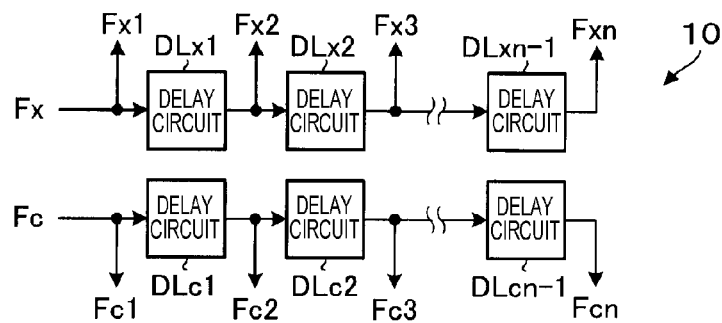
FIGS. 7A to 7D are block diagrams illustrating an example of a phase adjustment unit.
Figure 7B:
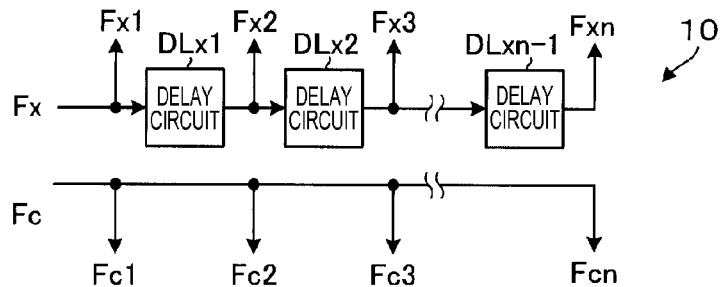
Figure 7C:
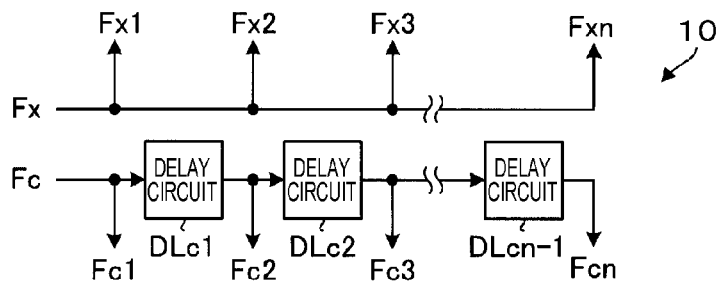
Figure 7D:
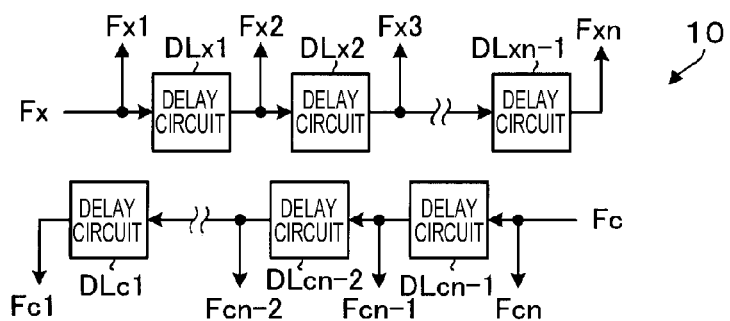

Here, as illustrated in FIG. 7A, the phase adjustment unit 10 sequentially delays the measured signal Fx by delay circuits DLx1 to DLxn−1 and generates output measured signals Fx1 to Fxn, and sequentially delays the reference signal Fc by delay circuits DLc1 to DLxn−1 and generates the output reference signals Fc1 to Fcn. Alternatively, as illustrated in FIG. 7B, the phase adjustment unit 10 may sequentially delay the measured signal Fx by the delay circuits DLx1 to DLxn−1 and may generate the output measured signals Fx1 to Fxn, and may generate the output reference signals Fc1 to Fcn without delaying the reference signal Fc. In addition, as illustrated in FIG. 7C, the phase adjustment unit 10 may generate the output measured signals Fx1 to Fxn without delaying the measured signal Fx, and may sequentially delay the reference signal Fc by the delay circuits DLc1 to DLxn−1 and may generate the output reference signals Fc1 to Fcn. Further, as illustrated in FIG. 7D, the phase adjustment unit 10 may be configured to set a maximum phase difference by wiring and inputting the measured signal Fx and the reference signal Fc such that an increasing order of an amount of each delay of the measured signal Fx and the reference signal Fc is different.

1-4: Method of Determining Amount of Delay and Delaying Signal

Next, a method of determining an amount of delay and delaying a signal will be described. As described above, the output data OUTj when each of the output measured signal Fxj and the output reference signal Fcj is input into FDSM (j) is a cyclic data array which is determined by a ratio of the frequency fx of the measured signal Fx and the frequency fc of the reference signal Fc. When the output measured signal Fxj in which the measured signal Fx is delayed and the reference signal Fc are input into FDSM (j), a cycle of the data array and a repeated pattern appearing in the data array are not changed compared to a case where the measured signal Fx is input without being delayed, but an initial position of the repeated pattern is shifted. When comparing the initial positions of the repeated pattern of the output before and after being delayed, the initial position of the repeated pattern is changed into the shape of a step as the amount of delay of the measured signal Fx becomes larger. In addition, when the amount of delay of the measured signal Fx is identical to Ka cycles (Ka is a natural number) of the measured signal Fx, a relative phase relationship between the output measured signal Fxj and the reference signal Fc is identical to that before being delayed (a relative phase relationship between the measured signal Fx and the reference signal Fc) (a condition A).

Similarly, even when the measured signal Fx is input into FDSM (j) without being delayed, and the output reference signal Fcj in which the reference signal Fc is delayed is input into FDSM (j), a repeated pattern and a cycle of the output data OUTj are not changed compared to a case where the reference signal Fc is input without being delayed, but an initial position of the repeated pattern is shifted. When comparing initial positions of the repeated pattern of the output before and after being delayed, the initial position of the repeated pattern is changed into the shape of a step as the amount of delay of the reference signal Fc becomes larger. When the amount of delay of the reference signal Fc is identical to Kb cycles (Kb is a natural number) of the reference signal Fc, a relative phase relationship between the measured signal Fx and the output reference signal Fcj is identical to that before being delayed (a relative phase relationship between the measured signal Fx and the reference signal Fc) (a condition B).

Here, in the amount of delay satisfying either the condition A or the condition B, a minimum amount of delay t is identical to the shorter cycle between one cycle of the measured signal Fx and one cycle of the reference signal Fc, and a relative phase relationship when the amount of delay of the measured signal Fx or the reference signal Fc is increased by t is identical to a state before being delayed. A case where the amount of delay satisfies either the condition A or the condition B is identical to a case where the initial position of the repeated pattern of the output data OUTj is not delayed. In order to disperse the idle tone, the initial position of the repeated pattern is shifted.

Therefore, a signal having a higher frequency between the frequencies of the measured signal Fx and the reference signal Fc is delayed and parallelized such that an amount of delay t identical to one cycle of the signal is divided into n, and thus it is possible to disperse a relative phase relationship between the parallel measured signal Fx and reference signal Fc, and according to this, the initial position of the repeated pattern is shifted, and thus the phase relationship of the idle tone between output data OUT1 to OUTn of n parallel FDSM (1) to FDSM (n) is dispersed.

Next, a case will be described in which, when an amount of delay at which the relative phase relationship is identical to the relative phase relationship between the measured signal Fx and the reference signal Fc is T, the same effect of dispersing the phase relationship of the idle tone among the output data OUT1 to OUTn of n parallel FDSM (1) to FDSM (n) is obtained even when the measured signal Fx is delayed and parallelized such that T is divided into n or the reference signal Fc is delayed and parallelized such that T is divided into n without delaying the measured signal Fx.

Even when comparing a case where a signal in which the reference signal Fc is delayed by δ is input into FDSM (j) with a case where a signal in which the measured signal Fx is preceded by δ without delaying the reference signal Fc is input into FDSM (j), the relative phase relationship between the output measured signal Fxj and the output reference signal Fcj is not changed. Therefore, when it is considered that the output measured signal Fxj in which the measured signal Fx is preceded by δ without delaying the reference signal Fc is input into FDSM (j) instead of inputting the output reference signal Fcj in which the reference signal Fc is delayed by δ into FDSM (j), there is no difficulty in describing the data array of the output data OUTj.

On the other hand, an amount of precedence at which the relative phase relationship is identical to the relative phase relationship between the output measured signal Fxj and the output reference signal Fcj is identical to the amount of delay T, and thus when the amount of delay or the amount of precedence is set as a variable number, the relative phase relationship between the output measured signal Fxj and the output reference signal Fcj has a cycle T.

Here, even when the output measured signals Fx1 to Fxn which are preceded and parallelized such that the amount of precedence T is divided into n are input into FDSM (1) to FDSM (n) or the output measured signals Fx1 to Fxn which are delayed and parallelized such that the amount of delay T is divided into n are input into FDSM (1) to FDSM (n), the relative phase relationship between the output measured signal and the output reference signal is dispersed within the cycle T at which the relative phase relationships are identical to each other.

Therefore, even when any one of "the reference signal Fc is delayed such that T is divided into n"→÷ "the measured signal Fx is preceded such that T is divided into n"→÷ "the measured signal Fx is delayed such that T is divided into n" is considered, it is understood that the relative phase relationship is dispersed. This is established even when the measured signal Fx and the reference signal Fc are substituted.

As described above, even when the measured signal Fx is delayed and parallelized such that T is divided into n or the reference signal Fc is delayed and parallelized such that T is divided into n without delaying the measured signal Fx, the same effect of dispersing the phase relationship of the idle tone among the output data OUT1 to OUTn of n parallel FDSM (1) to FDSM (n) is obtained.

Here, as the amount of delay T at which the relative phase relationship is identical to the relative phase relationship between the output measured signal Fxj and the output reference signal Fcj, an amount of delay is able to be selected to be identical to either the Ka cycle of the measured signal Fx (Ka is a natural number) or the Kb cycle of the reference signal Fc (Kb is a natural number), but when a large amount of delay (Ka is greater than or equal to 2 or Kb is greater than or equal to 2) is set, a bias may occur in a dispersion of the phase relationship of the idle tone, and thus it is noticed. Furthermore, a general condition in which a bias does not occur in the dispersion of the phase relationship of the idle tone will be described later.

It may be convenient that a minimum amount of delay among the amount of delay at which the relative phase relationship is identical to the relative phase relationship between the output measured signal Fxj and the output reference signal Fcj is selected as T such that cyclic properties smaller than T may not be considered. That is, the amount of delay T may be determined to be identical to one cycle of a signal having a higher frequency between the frequency fx of the measured signal Fx and the frequency fc of the reference signal Fc, and the signal may be delayed and parallelized such that the one cycle is divided into n. As illustrated in an example of FIG. 9, when the frequency fx is higher than the frequency fc, the amount of delay is set such that the one cycle of the measured signal Fx is divided into n, and the measured signal Fx or the reference signal Fc is delayed and parallelized, and thus the relative phase relationship of the idle tone among the output data OUT1 to OUTn is dispersed, and a cancelling effect is able to be used in a combined value of the output data OUT1 to OUTn. It is preferable that a phase difference between the delay signals is an equal delay in which a maximum value is able to be ensured as a minimum phase difference, and at this time, a maximum dispersion effect is able to be obtained.

Figure 8:
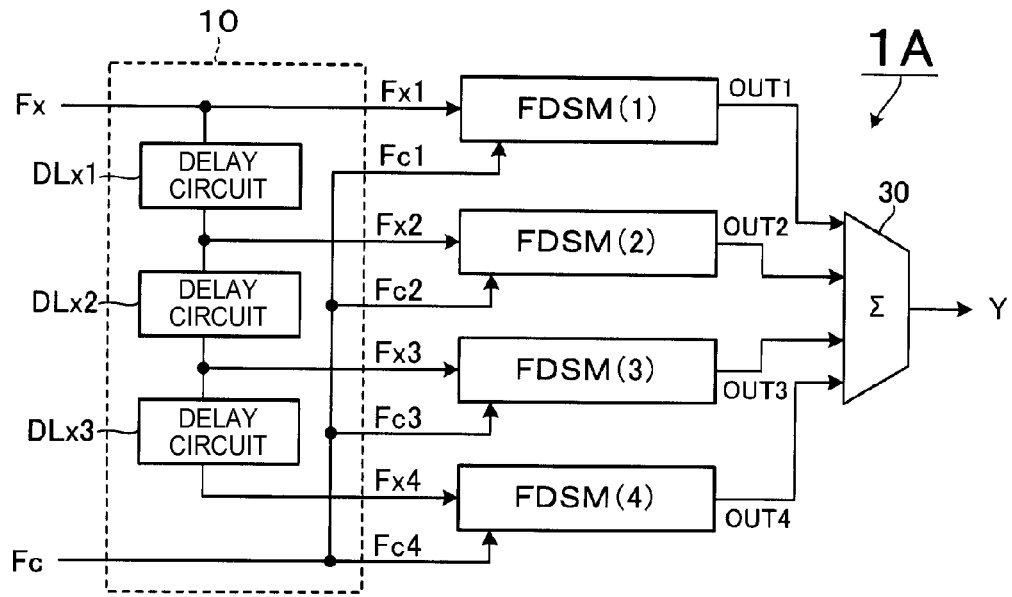
FIG. 8 is a block diagram illustrating a configuration example of the idle tone dispersion device when a frequency of the measured signal is higher than a frequency of the reference signal.
Figure 9:
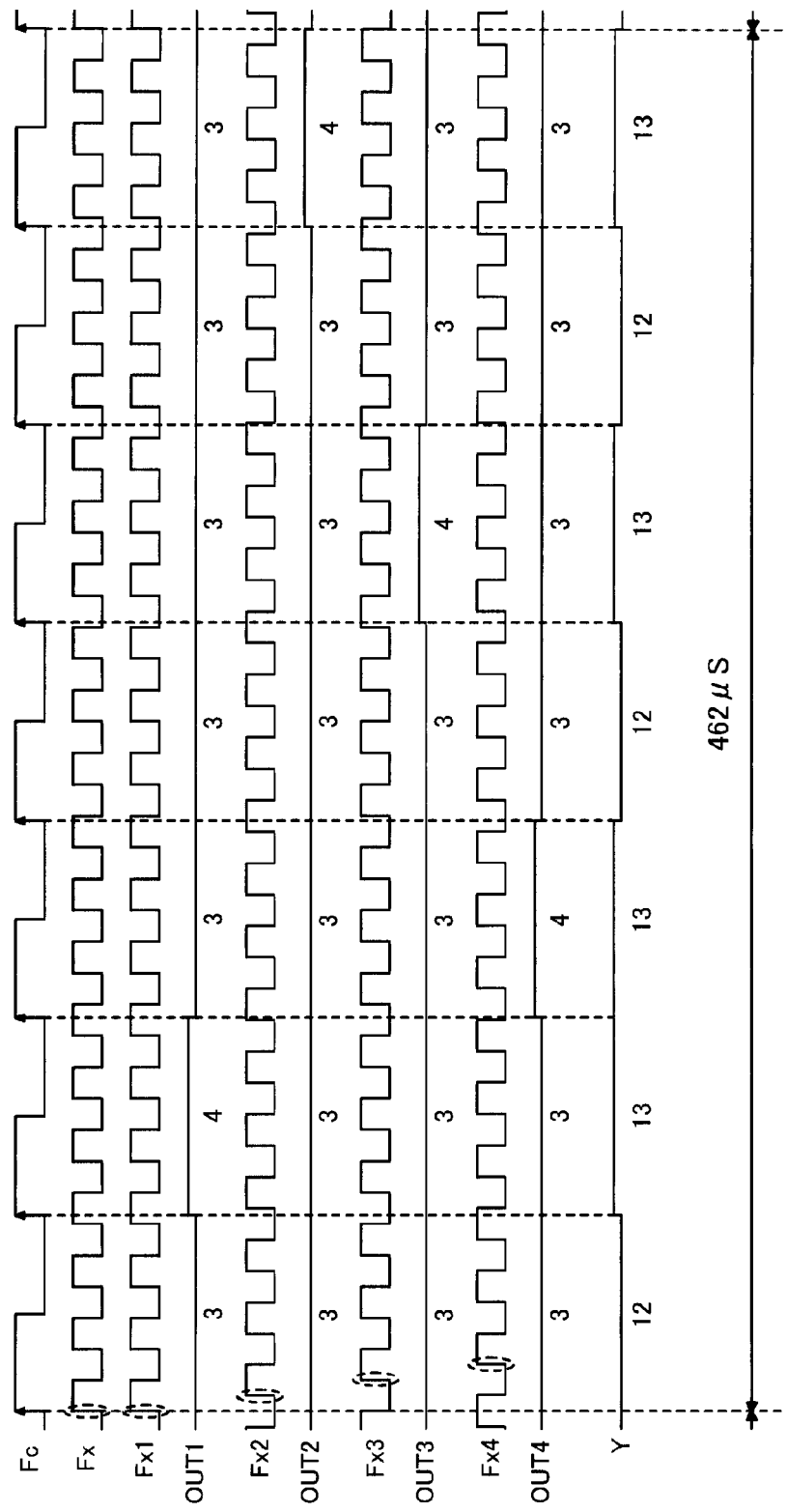
FIG. 9 is a timing chart of the idle tone dispersion device illustrated in FIG. 8.

1-4-1: Case in which Frequency Fx of Measured Signal Fx is Higher than Frequency fc of Reference Signal Fc In the output measured signal Fxj and the output reference signal Fcj illustrated in FIG. 2, the minimum amount of delay at which the relative phase relationships are identical to each other is 21 μS which is identical to the one cycle of the measured signal Fx from fx>fc. When n is 4, the idle tone dispersion device 1A is able to be configured as illustrated in FIG. 8. Here, an amount of delay of the delay circuits DLx1 to DLx3 is 21/4 μS. A timing chart of the idle tone dispersion device 1A illustrated in FIG. 8 is illustrated in FIG. 9. As illustrated in the same drawing, a pattern of the output data OUT1 to OUT4 is dispersed, and thus the idle tone is dispersed in the frequency delta-sigma modulation signal Y.

Figure 10:
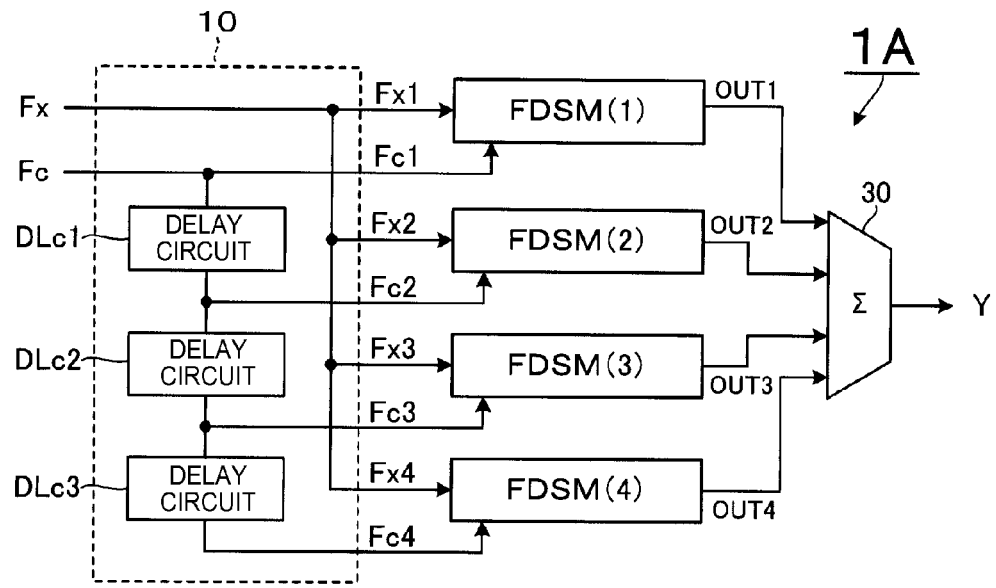
FIG. 10 is a block diagram illustrating a configuration example of the idle tone dispersion device when the frequency of the reference signal is higher than the frequency of the measured signal.

1-4-2: Case in which Frequency Fc of Reference Signal Fc is Higher than Frequency fx of Measured Signal Fx Next, a case where the frequency fc of the reference signal Fc is higher than the frequency fx of the measured signal Fx will be described. When n is 4, the idle tone dispersion device 1A is able to be configured as illustrated in FIG. 10.

Figure 11:
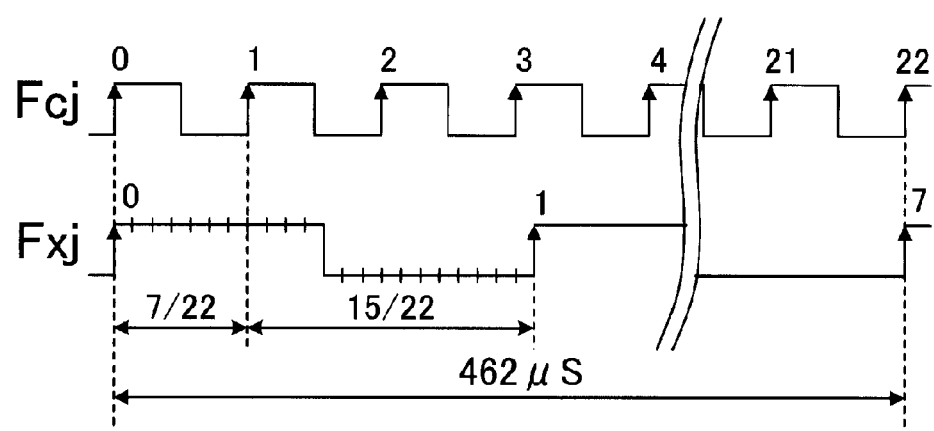
FIG. 11 is a timing chart illustrating an example of the output reference signal and the output measured signal.

In the operation of FDSM (j) (j is a natural number less than or equal to n), a signal (15.15 kHz) at one cycle of 66 μS is considered as the measured signal Fx, and a signal (47.619047 kHz) at one cycle of 21 μS is considered as the reference signal Fc instead of the frequency relationship in an example of FIG. 2. A frequency ratio [fx:fc] of the measured signal Fx and the reference signal Fc is denoted by the following expression.

fx:fc=1/66e$^{-6}$: 1/21e$^{-6}$=7:22 is obtained, and thus a time of 7 cycles of the measured signal Fx is identical to a time of 22 cycles of the reference signal Fc, and thus it is found that the same data array is repeated for each 66 μS×7=21 μS×22=462 μS. As the operation of FDSM (j), as illustrated in FIG. 11, when the moment at which the rising edges of the output reference signal Fcj and the output measured signal Fxj are identical to each other is used as an origination, the output measured signal Fxj progresses by 7/22 cycles while the output reference signal Fcj progresses for one cycle, and the count data Dc is increased by 0 or 1.

Figure 12:
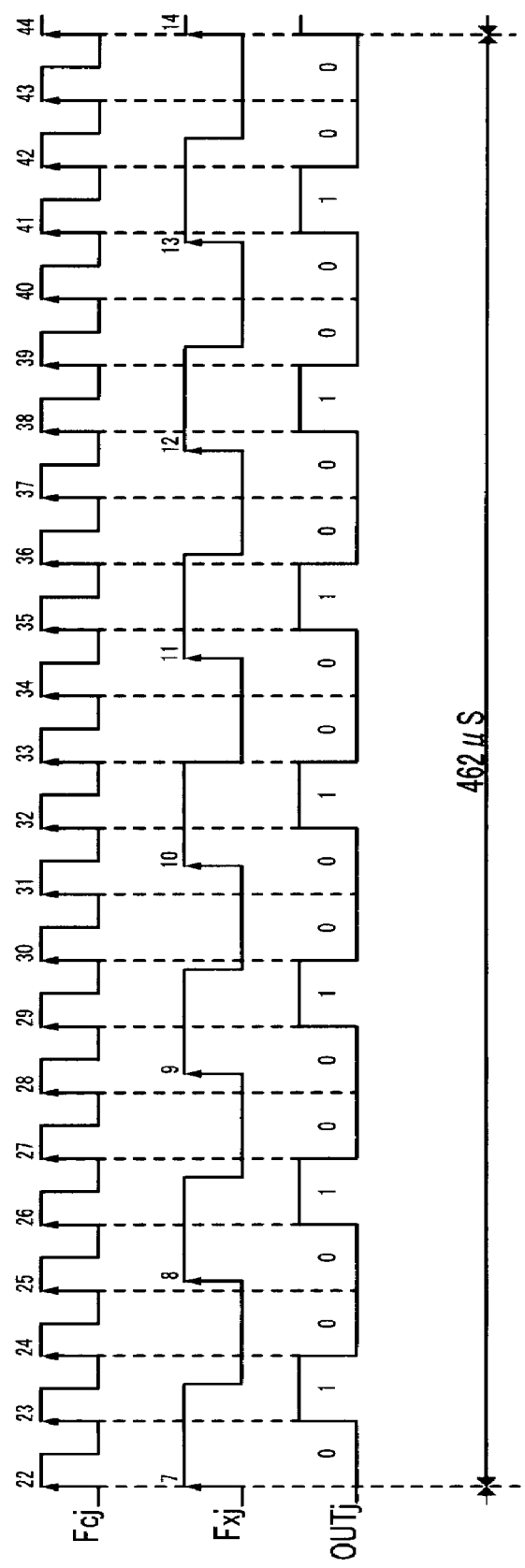
FIG. 12 is a timing chart illustrating an example of the output data of FDSM.

In this case, as illustrated in FIG. 12, in the output data OUTj of FDSM (j), a data array of a cycle of 462 μS "0100100100100100100100" appears. Furthermore, in FDSM (j) illustrated in FIG. 12, the output of the first latch 22 and the second latch 23 at the time of initiating the operation is indeterminate, and thus a data array of the next second circulation in which the data array of initial 462 μS is circulated is illustrated.

Figure 13:
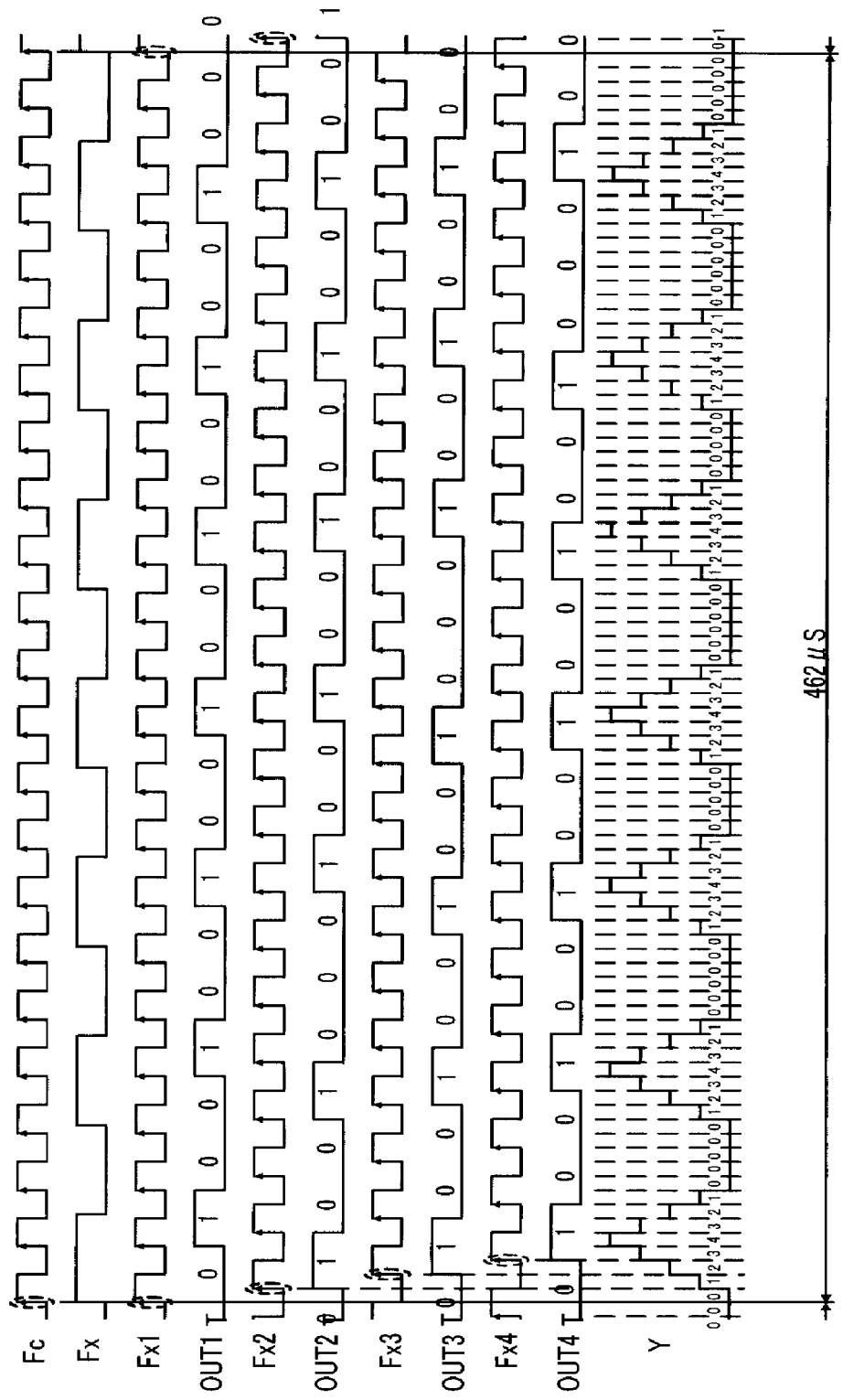
FIG. 13 is a timing chart of the idle tone dispersion device illustrated in FIG. 10.
Figure 14:
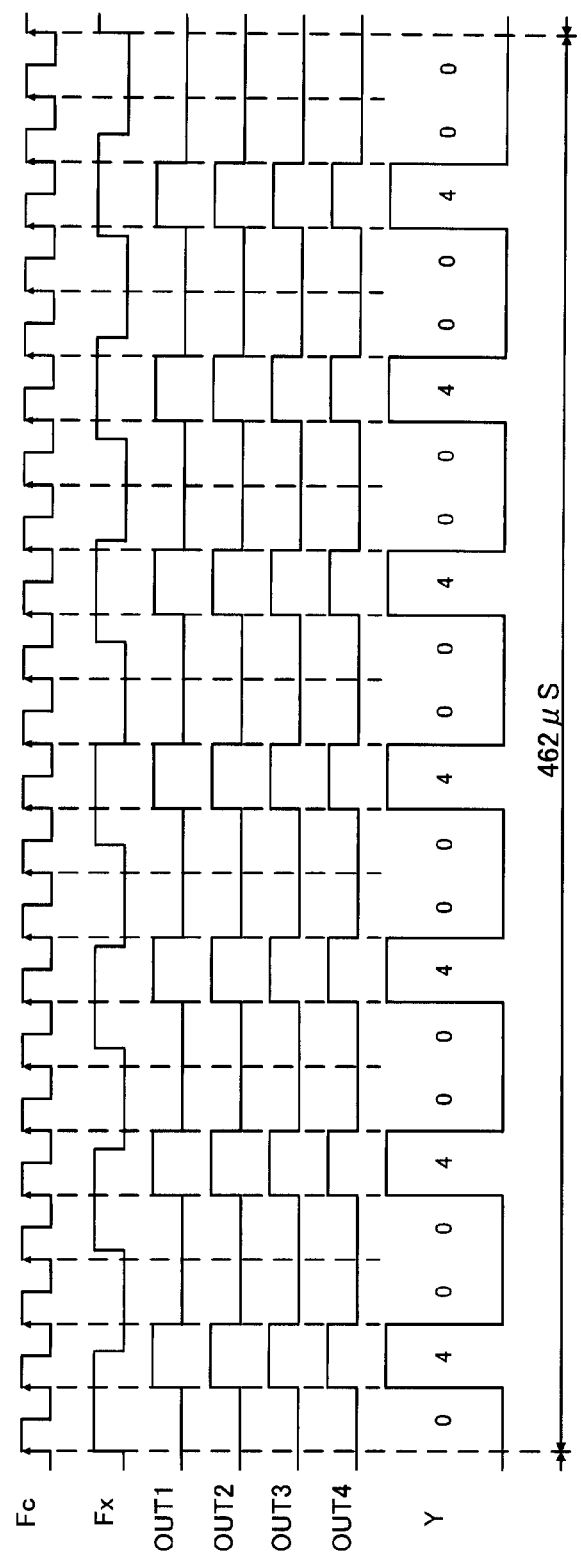
FIG. 14 is a timing chart of the device illustrated in FIG. 5 in which the phase adjustment unit is eliminated from the idle tone dispersion device illustrated in FIG. 10.

The one cycle of the reference signal Fc of which the frequency is higher than that of the measured signal Fx is 21 μS, and thus the amount of delay of the delay circuits DLc1 to DLc3 illustrated in FIG. 10 is 21/4 μS. A timing chart of the idle tone dispersion device 1A illustrated in FIG. 10 is illustrated in FIG. 13. As illustrated in the same drawing, the pattern of the output data OUT1 to OUT4 is dispersed, and thus the idle tone is dispersed in the frequency delta-sigma modulation signal Y. In contrast, a timing chart of the device illustrated in FIG. 5 in which the phase adjustment unit 10 is eliminated from the idle tone dispersion device 1A illustrated in FIG. 10 is illustrated in FIG. 14. In this case, the idle tone is not dispersed, and thus SNR is not able to be improved.

In the idle tone dispersion device 1A of the first embodiment, FDSM (1) to FDSM (n) generate the output data OUT1 to OUTn in a data stream format. In addition, as described above, when the shorter cycle between the one cycle of the measured signal Fx and the one cycle of the reference signal Fc is Tx, the phase adjustment unit 10 sequentially delays one of the measured signal Fx and the reference signal Fc by Tx/n, and generates the output measured signals Fx1 to Fxn and the output reference signals Fc1 to Fcn.

Here, the cycle of the idle tone is determined according to the one cycle of the measured signal Fx and the one cycle of the reference signal Fc, but is not below Tx. On the other hand, the phase of the idle tone which is overlapped with each of the output data OUT1 to OUTn is determined according to the phase of the n sets of output measured signals and output reference signals (Fx1, Fc1), (Fx2, Fc2), . . . , and (Fxn, Fcn) supplied to FDSM (1) to FDSM (n). As described above, when one of the measured signal Fx and the reference signal Fc is sequentially delayed by Tx/n, the phase of the idle tone which is overlapped with each of the output data OUT1 to OUTn is able to be shifted by Tx/n, and the phase of the idle tone which is overlapped with each of the output data OUT1 to OUTn is able to be dispersed.

In addition, as described with reference to FIGS. 7A to 7D, a method of delaying includes various aspects. The phase of the idle tone is determined according to the phase of the output measured signal and the output reference signal supplied to FDSM, and thus then sets of output measured signals and output reference signals (Fx1, Fc1), (Fx2, Fc2), . . . , and (Fxn, Fcn) may be generated by relatively adjusting the phase of the measured signal Fx and the reference signal Fc such that the phase of the idle tone which is overlapped with the output data OUT1 to OUTn is shifted by Tx/n.

Specifically, when the phase difference between the output measured signal Fxi and the output reference signal Fci supplied to i-th (i is a natural number less than or equal to n−1) FDSM (i) is Pi, the phase adjustment unit 10 may generate the n sets of output measured signals and output reference signals (Fx1, Fc1), (Fx2, Fc2), . . . , and (Fxn, Fcn) by relatively adjusting the phase between the measured signal Fx and the reference signal Fc such that Tx/n=Pi+1−Pi.

In addition, in the idle tone dispersion device 1A according to the first embodiment, even when the measured signal Fx and the reference signal Fc are interchanged, the effect of dispersing the phase of the idle tone corresponding to each of n parallel FDSM (1) to FDSM (n) is not degraded only by changing a counting signal and a counted signal, and thus it is not necessary to change the configuration (for example, when a usual count configuration of the frequency measurement device is used as a reciprocal configuration, or the like). In contrast, in the technology of Dag T Wisland, et al., ESS-CIRC2002, pp. 687-690, 2002, the measured signal is delayed based on the one cycle (the half cycle) of the measured signal, and thus when the measured signal and the reference signal are interchanged, it is necessary to change the amount of delay.

2. Second Embodiment 2-1: Overall Configuration

The idle tone dispersion device 1A of the first embodiment described above corresponds to a data stream. On the other hand, an idle tone dispersion device 1B of a second embodiment corresponds to a bit stream.

Figure 15:
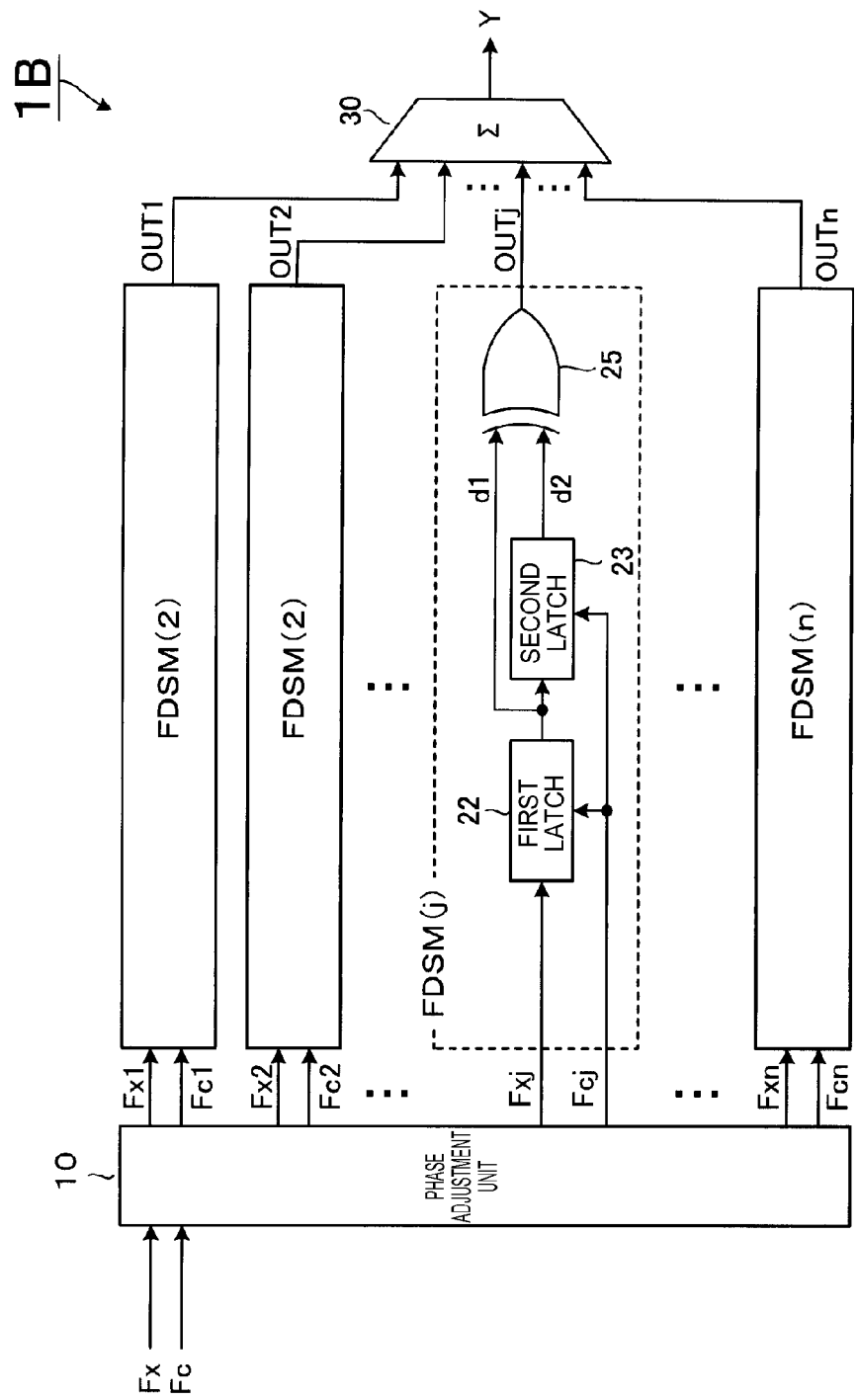
FIG. 15 is a block diagram of an idle tone dispersion device according to a second embodiment.

FIG. 15 illustrates a block diagram of the idle tone dispersion device 1B according to the second embodiment. The idle tone dispersion device 1B has the same configuration as that of the idle tone dispersion device 1A illustrated in FIG. 1 except for the detailed configuration of FDSM (1) to FDSM (j).

FDSM (j) includes the first latch 22 which latches the output measured signal Fxj in synchronization with the rising edge of the output reference signal Fcj, and outputs the first data d1, the second latch 23 which latches the first data d1 in synchronization with the rising edge of the output reference signal Fcj, and outputs the second data d2, and an exclusive OR circuit 25 which calculates exclusive OR of the first data d1 and the second data d2, and generates the output data OUTj. The first latch 22 and the second latch 23 of the second embodiment, for example, are configured of a D-FLIP-FLOP circuit. Furthermore, FDSM (1) to FDSM (j−1) and FDSM (j+1) to FDSM (n) have the same configuration as that of FDSM (j).

A difference between FDSM (j) of the second embodiment and FDSM (j) of the first embodiment illustrated in FIG. 1 is that, in the first embodiment, the count data Dc is maintained by the first latch 22, the rising edge of the output measured signal Fxj which is observed while the output reference signal Fcj is transitioned for one cycle is counted, and an increase in the obtained count data Dc is output as the output data OUTj, whereas in the second embodiment, a High or Low state of the output measured signal Fxj is maintained by the first latch 22, and the even or odd number of times of inversion while the output reference signal Fcj is transitioned for one cycle is output as the output data OUTj (when the number of times of inversion is an even number, 0 is output, and when the number of times of inversion is an odd number, 1 is output).

However, the one cycle of the output measured signal Fxj is configured of two times of inversion transition of High and Low, and thus the degree of a change of a variation in the output measured signal Fxj with respect to the output reference signal Fcj, which affects the output data OUTj, is doubled compared to a case where the count value of FIG. 1 is maintained. Accordingly, in FDSM (j) of FIG. 1, a behavior of the idle tone in FDSM (j) having a bit stream configuration is identical to a behavior when the output measured signal Fxj having a double frequency is input into FDSM (j). When the properties described above are considered with respect to the operation of FDSM (j) of the second embodiment, as desired, the frequency fx of the measured signal Fx may be substituted by a frequency 2fx.

2-2: Case in Which Frequency 2fx is Higher than Frequency fc

Next, a case where the frequency 2fx (corresponding to the measured signal Fx) is higher than the frequency fc of the reference signal Fc will be described. As the measured signal Fx, a signal (47.619047 kHz) at one cycle of 21 μS is considered. In addition, as the reference signal Fc, a signal (15.15 kHz) at one cycle of 66 μS is considered. The one cycle of the measured signal Fx is configured of two times of inversion transition of High and Low, and thus hereinafter, is regarded as a value two times of the frequency fx. This corresponds to a case where the double frequency 2fx of the measured signal Fx is higher than the frequency fc of the reference signal Fc, and a frequency ratio of 2fx:fc is denoted by the following expression.

$$2fx:fc=2/21e^{-6}:1/66e^{-6}=44:7$$

In this case, a time of 44 times of inversion transition of the measured signal Fx is identical to a time of 7 cycles of the reference signal Fc. That is, the same data array is repeated for each 21/2 μS×44=66 μS×7=462 μS.

Figure 16:
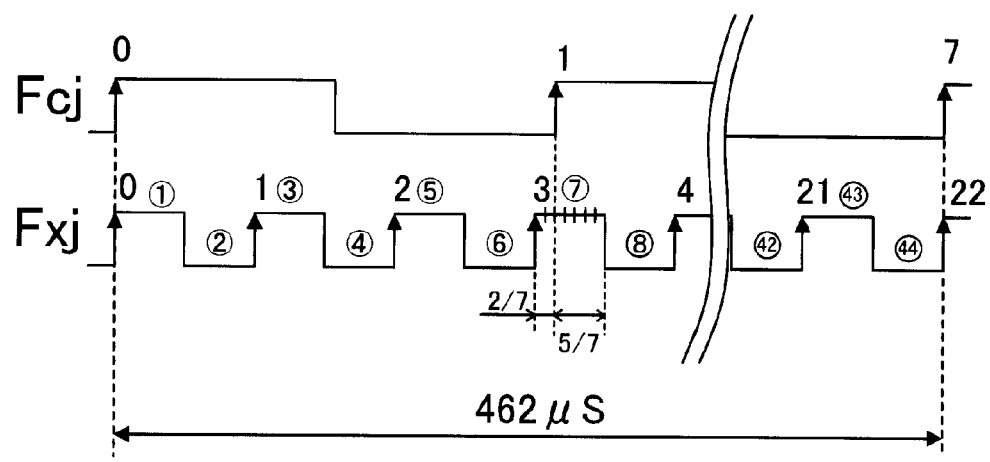
FIG. 16 is a timing chart illustrating an example of the output reference signal and the output measured signal.

When considering the operation of FDSM (j) at this time, the output measured signal Fxj is inversion transitioned by 44/7=6+2/7 times while the output reference signal Fcj progresses for one cycle. FIG. 16 illustrates such a relationship by using a case where the rising edges of the output reference signal Fcj and the output measured signal Fxj are identical to each other as an origination.

Figure 17:
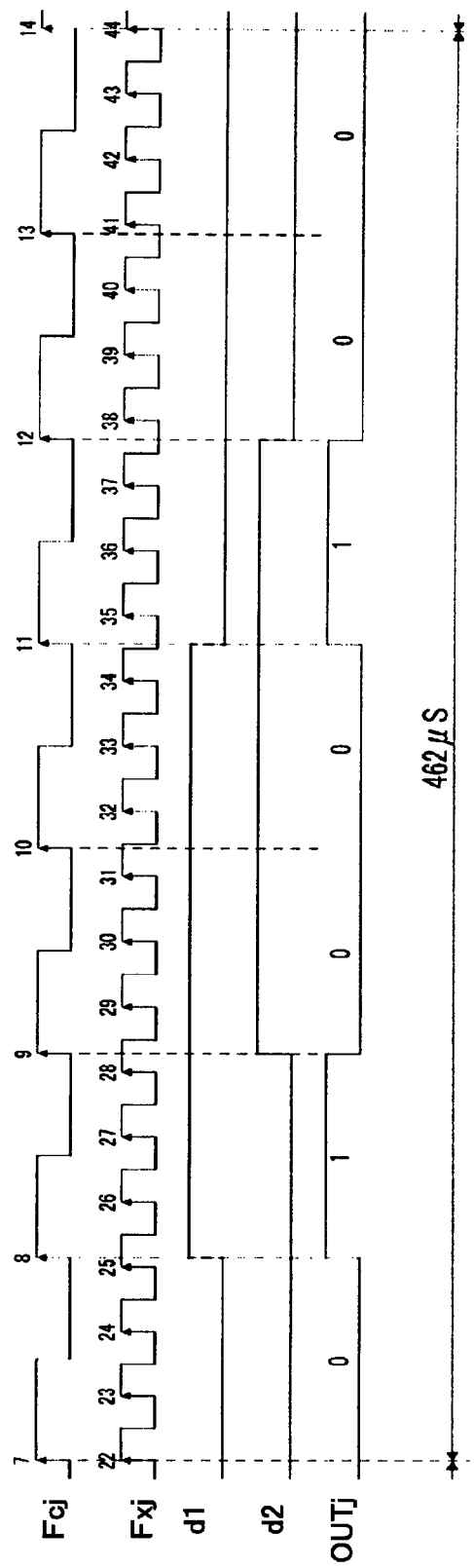
FIG. 17 is a timing chart illustrating an example of the output data of FDSM.

In the data array of the output data OUTj of actual FDSM (j), a bit array of "0100100" as illustrated in FIG. 17 appears at a cycle of 462 μS. Furthermore, FDSM (j) of FIG. 15 has an indeterminate output of the first latch 22 and the second latch 23 at the time of initiating the operation, and FIG. 17 illustrates a repeated pattern of the next second circulation in which the cycle of initial 462 μS is circulated.

The behavior of FDSM (j) corresponding to a bit stream which is "2fx>fc" is identical to the behavior when a signal having a frequency two times of the frequency of the measured signal Fx is input into FDSM (j) in FDSM (j) corresponding to a data stream illustrated in FIG. 1, and thus the delay may be performed such that the half cycle of the measured signal Fx is divided based on the half cycle.

Figure 18:
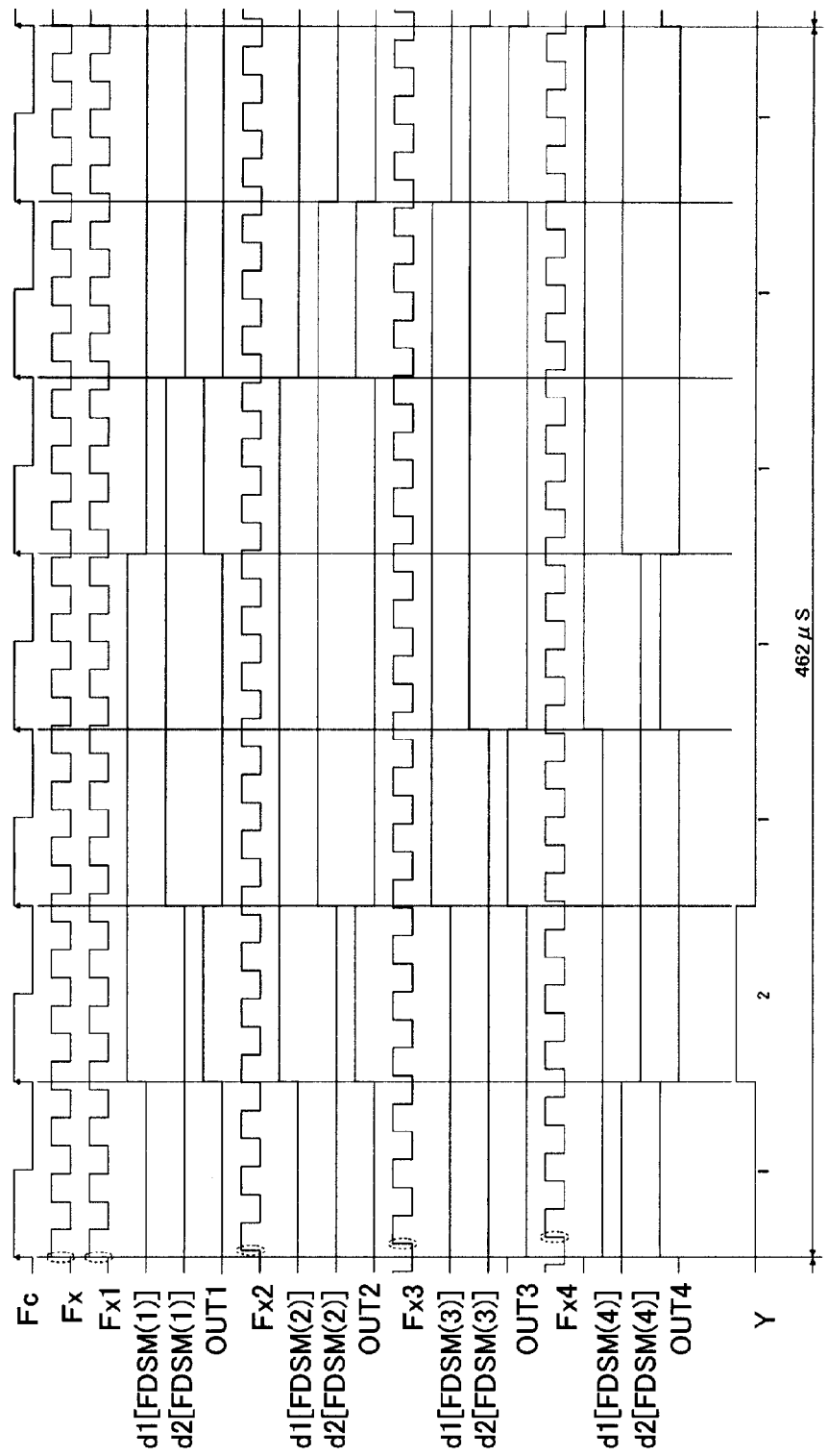
FIG. 18 is a timing chart when n=4 in the idle tone dispersion device.

When n is 4, the configuration illustrated in FIG. 8 may be applied. Here, a delay time of the delay circuits DLx1 to DLx3 may be a time obtained by dividing the half cycle of the measured signal Fx into four (21/8 μS). In this case, a timing chart is as illustrated in FIG. 18, and the initial position of the repeated pattern of the output data OUT1 to OUT4 is shifted, and thus the idle tone is dispersed.

Figure 19:
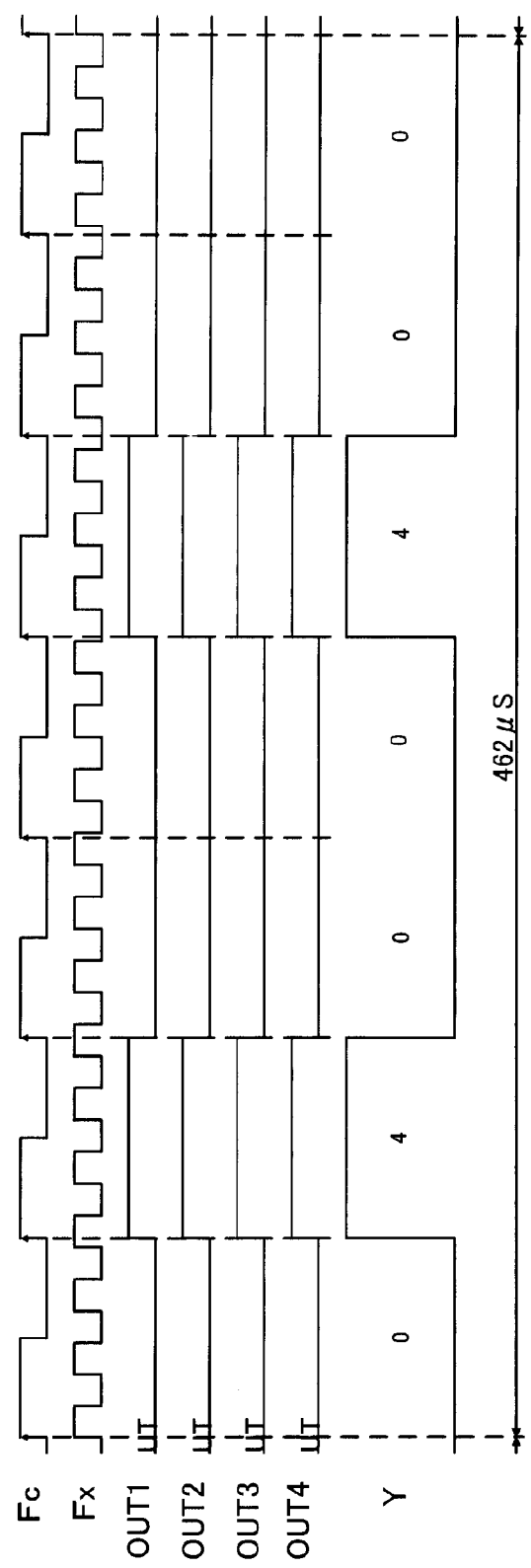
FIG. 19 is a timing chart of the device in which the phase adjustment unit is eliminated from the idle tone dispersion device.

When the measured signal Fx is not delayed, and as illustrated in FIG. 5, the four FDSM (1) to FDSM (4) are simply parallelized, a timing chart thereof is illustrated in FIG. 19. In this case, the initial positions of the repeated pattern of the output data OUT1 to OUT4 are identical to each other, and thus SNR of the frequency delta-sigma modulation signal Y is not able to be improved.

2-3: Case in which Frequency Fc is Higher than Frequency 2Fx

Next, a case where the frequency fc of the reference signal Fc is higher than the double frequency 2fx of the measured signal Fx will be described.

In the operation of FDSM (j) (j is a natural number less than or equal to n), a signal (15.15 kHz) at one cycle of 66 μS is considered as the measured signal Fx, and a signal (47.619047 kHz) at one cycle of 21 μS is considered as the reference signal Fc instead of the frequency relationship in an example of FIG. 16. The one cycle of the measured signal Fx is configured of two times of inversion transition of High and Low, and thus hereinafter, is regarded as a value two times of the frequency fx. This corresponds to a case where the frequency fc of the reference signal Fc is higher than the double frequency 2fx of the measured signal Fx, and a frequency ratio of 2fx:fc is denoted by the following expression.

$$2fx{:}fc{=}2/66e^{-6}{:}1/21e^{-6}{=}7{:}11$$

Figure 20:
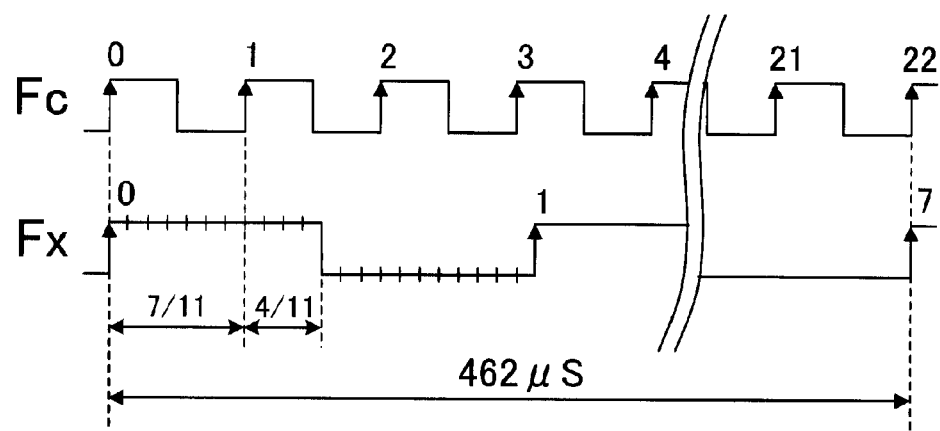
FIG. 20 is a timing chart illustrating an example of the output reference signal and the output measured signal.

Therefore, a time of 7 cycles of the measured signal Fx is identical to a time of 11 cycle of the reference signal Fc, and the same data array is repeated for each 66/2 μS×7=21 μS×11=231 μS. As the operation of FDSM (j), as illustrated in FIG. 20, when the moment at which the rising edges of the output reference signal Fcj and the output measured signal Fxj are identical to each other is used as an origination, the output reference signal Fcj progresses by 7/22 cycles while the output measured signal Fxj progresses for one cycle, and thus is inversion transitioned by 7/22×2=7/11 times.

Figure 21:
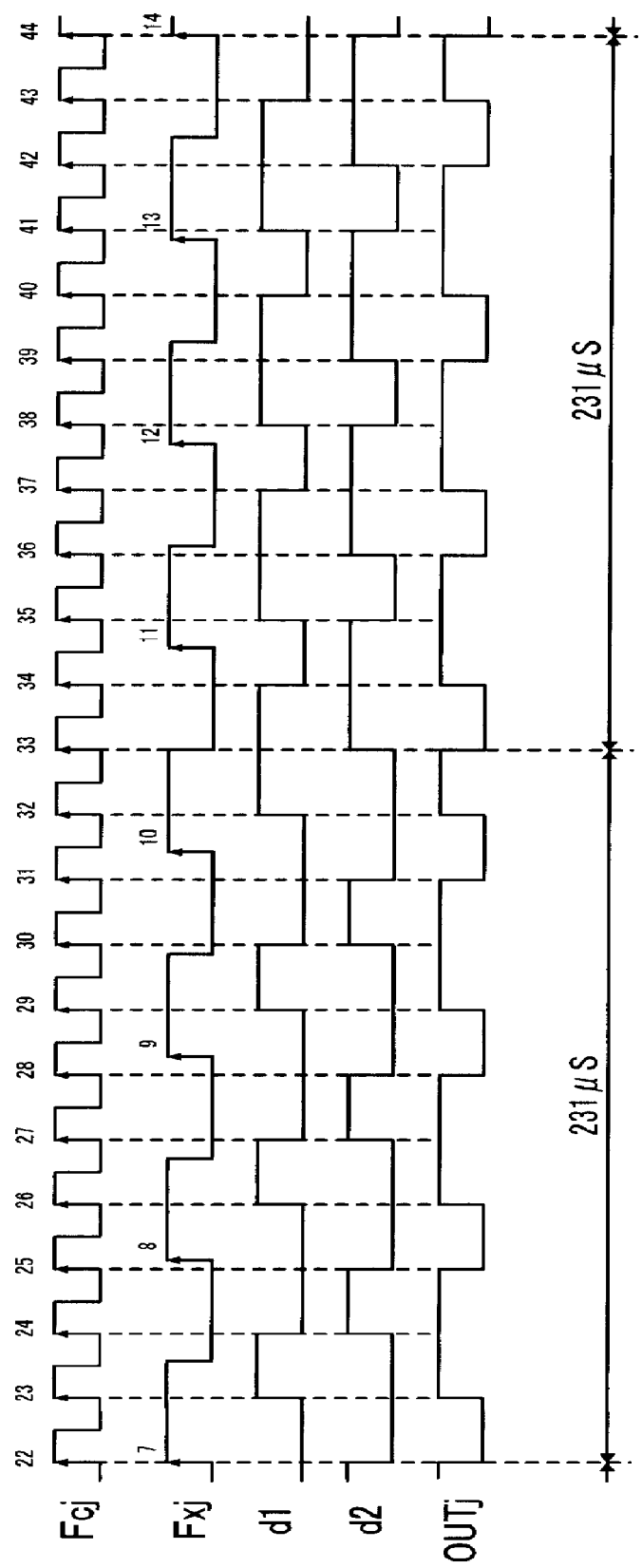
FIG. 21 is a timing chart illustrating an example of the output data of FDSM.

In this case, in the output data OUTj of FDSM (j), a bit array of "01101101101" as illustrated in FIG. 21 appears at a cycle of 231 μS. Furthermore, FDSM (j) of FIG. 21 also has an indeterminate output of the first latch 22 and the second latch 23 at the time of initiating the operation, and thus a bit array of the next second circulation in which an initial bit array is circulated is illustrated.

Figure 22:
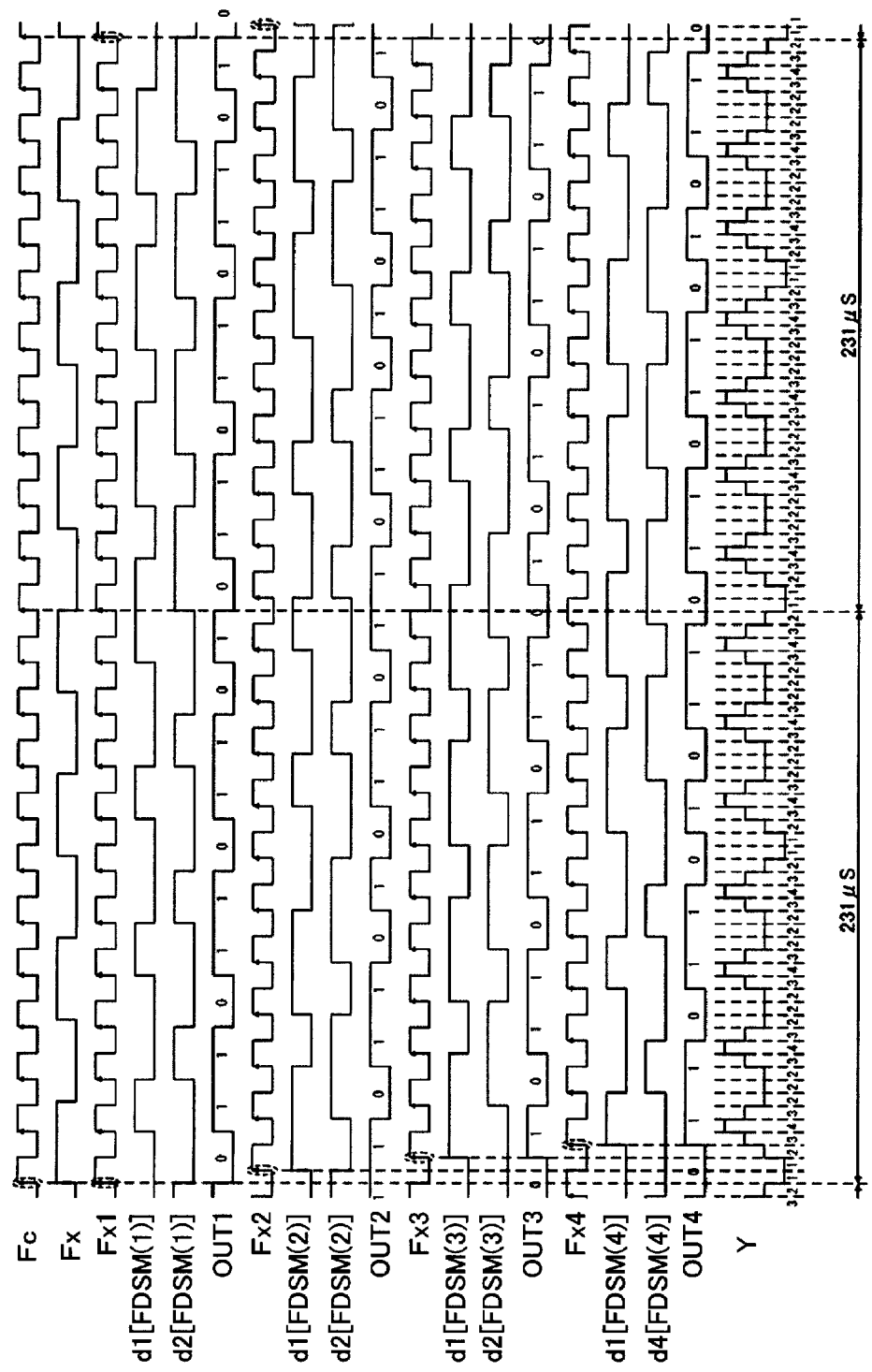
FIG. 22 is a timing chart when n=4 in the idle tone dispersion device.

When n is 4, the configuration illustrated in FIG. 10 may be applied. Here, a delay time of the delay circuits DLc1 to DLc3 may be a time obtained by dividing the one cycle of the reference signal Fc into four (21/4 μS). In this case, a timing chart is as illustrated in FIG. 22, and the initial position of the repeated pattern of the output data OUT1 to OUT4 is shifted, and thus the idle tone is dispersed.

Figure 23:
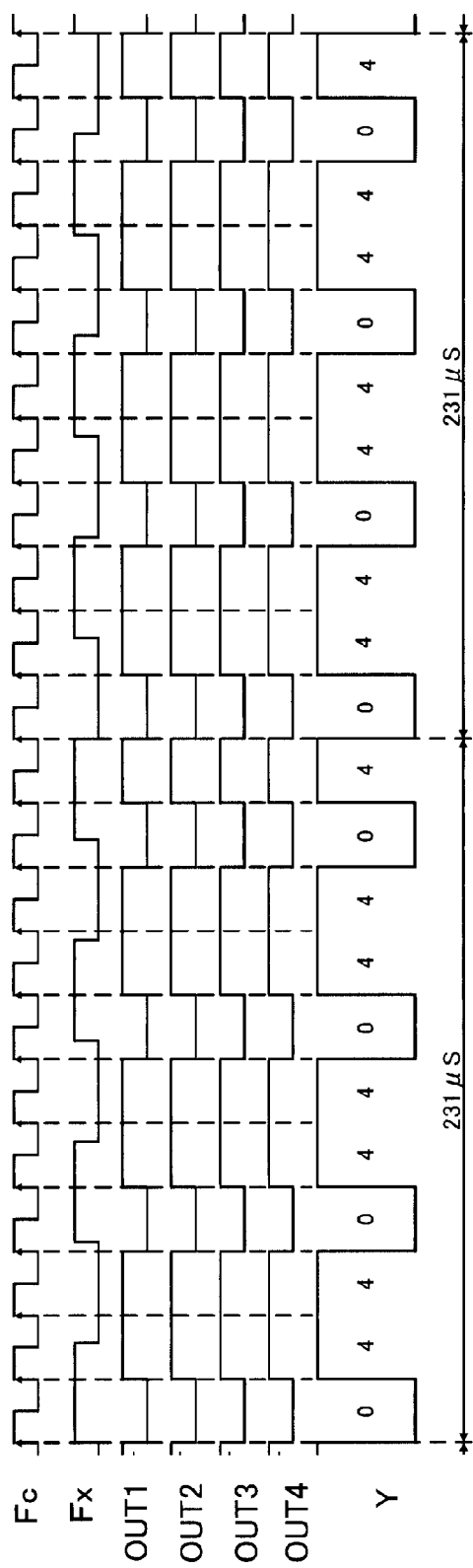
FIG. 23 is a timing chart of the device in which the phase adjustment unit is eliminated from the idle tone dispersion device.

When the measured signal Fx is not delayed, and as illustrated in FIG. 5, the four FDSM (1) to FDSM (4) are simply parallelized, a timing chart thereof is illustrated in FIG. 23. In this case, the initial positions of the repeated pattern of the output data OUT1 to OUT4 are identical to each other, and thus SNR of the frequency delta-sigma modulation signal Y is not able to be improved.

In the idle tone dispersion device 1B corresponding to a bit stream of the second embodiment, an absolute frequency is not able to be acquired, and thus when one or both of the frequencies are unknown, the determination is required to be performed by rough measurement using a separately disposed frequency counter or the like, but in an actual application, there are regulations of an operation frequency of the frequency counter, and thus it is difficult to consider that all of the unknown frequencies are measured. For example, by using the reference signal Fc of 10 MHz, when a system of measuring a frequency of a quartz sensor of a 26 MHz is considered, it is clear that a high-low relationship between both frequencies is not necessarily measured.

In the idle tone dispersion device 1B of the second embodiment, FDSM (1) to FDSM (n) generate the output data OUT1 to OUTn in a bit stream format. In addition, as described above, when the shorter cycle between the half cycle of the measured signal Fx and the one cycle of the reference signal Fc is Tx, the phase adjustment unit 10 sequentially delays one of the measured signal Fx and the reference signal Fc by Tx/n, and generates the output measured signals Fx1 to Fxn and the output reference signals Fc1 to Fcn.

Similar to the idle tone dispersion device 1A of the first embodiment, in the idle tone dispersion device 1B of the second embodiment, the phase adjustment unit 10 may relatively adjust the phase between the measured signal Fx and the reference signal Fc such that the phase of the idle tone which is overlapped with the output data OUT1 to OUTn is shifted by Tx/n, and may generate the n sets of output measured signals and output reference signals (Fx1, Fc1), (Fx2, Fc2), . . . , and (Fxn, Fcn).

Specifically, when the phase difference between the output measured signal Fxi and the output reference signal Fci supplied to the i-th (i is a natural number less than or equal to n−1) FDSM (i) is Pi, the phase adjustment unit 10 may relatively adjust the phase between the measured signal Fx and the reference signal Fc such that Tx/n=Pi+1−Pi, and may generate n sets of output measured signals and output reference signals (Fx1, Fc1), (Fx2, Fc2), . . . , and (Fxn, Fcn).

3. Third Embodiment

In a third embodiment, an expansion of the method of dispersing the idle tone described in the first embodiment and the second embodiment described above will be described.
3-1: Shift of Delay Time In the first embodiment and the second embodiment described above, the relative phase relationship between the output measured signal Fxj and the output reference signal Fcj is dispersed, and thus the relative phase relationship of the idle tone among the output data OUT1 to OUTn of n parallel FDSM (1) to FDSM (n) is dispersed, and SNR of the frequency delta-sigma modulation signal Y is improved.

Specifically, the delay is performed such that one cycle t (when 2fx>fc in a bit stream, a half cycle is t) of a signal having the higher frequency between the frequency fx of the measured signal Fx or the double frequency 2fx thereof, and the frequency fc of the reference signal Fc is divided into n based on the one cycle t, and thus the relative phase relationship of the idle tone among the output data OUT1 to OUTn is efficiently dispersed. When the phase difference between the output measured signal Fxj and the output reference signal Fcj is Pj, an equal delay satisfying Pj−1=Pj is preferable, and thus the idle tone is able to be maximally dispersed.

Here, a case where Pj−1 is not identical to Pj will be considered. The effect of a case in which, when a reference amount is D, and the delay is performed such that D is divided into n, D is not identical to one cycle Tx of a signal having the higher frequency (the shorter cycle) between the frequency of the measured signal Fx and the frequency of the reference signal Fc will be described.

Figure 24:
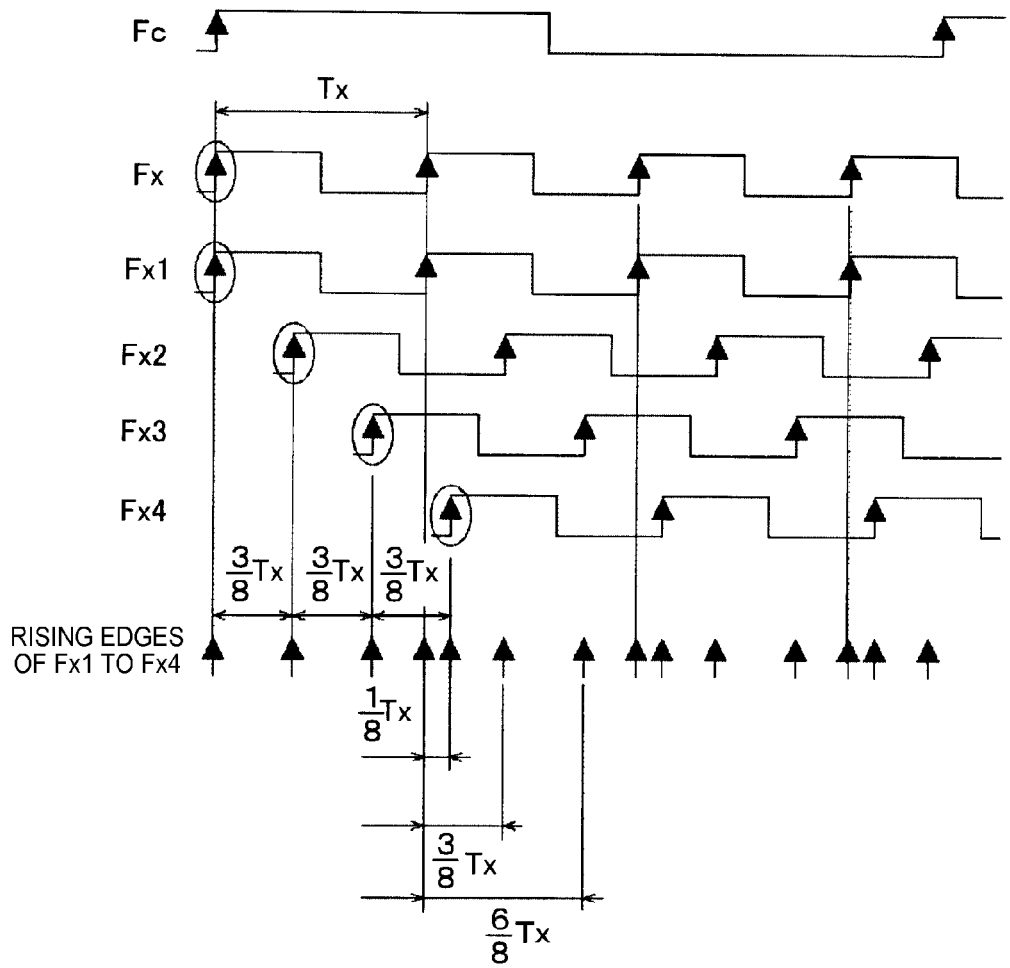
FIG. 24 is a timing chart of the idle tone dispersion device when 1.5 cycles of the measured signal is D, and a delay in which D is equally divided into four is applied.

When D is shifted from Tx, a distribution in the phase relationship of the idle tone among the output data OUT1 to OUTn of n parallel FDSM (1) to FDSM (n) is biased, and thus a maximum dispersion effect is not able to be obtained. However, the idle tone is correspondingly dispersed except for a case where the entire idle tones are in the same phase, and thus an idle tone suppression effect is obtained, and a constant effect is obtained. For example, FIG. 24 illustrates an example in which 1.5 cycles of the measured signal Fx are D, and D is equally divided into four. In this case, the idle tone dispersion device 1A has the configuration illustrated in FIG. 8. A delay time of the delay circuits DLx1 to DLx3 is denoted by the following expression.

$$Tx{\times}3/2{\times}1/4{=}3Tx/8$$

As illustrated in FIG. 24, the output measured signals Fx1 to Fx4 are delayed by 3/8×Tx and rises up for each one cycle of the measured signal Fx, and the rising of the output measured signal Fx4 is a timing at which the measured signal Fx is delayed by 1/8×Tx at a 2-nd cycle. The rising edge exceeding the one cycle is considered by subtracting one cycle therefrom. That is, even when 1.5 cycles of the measured signal Fx are equally divided into four, in practice, the cycle is not equally divided, such as 0, 1/8, 3/8, and 6/8, and thus the maximum dispersion effect is not obtained, but the constant effect is obtained.

Figure 25:
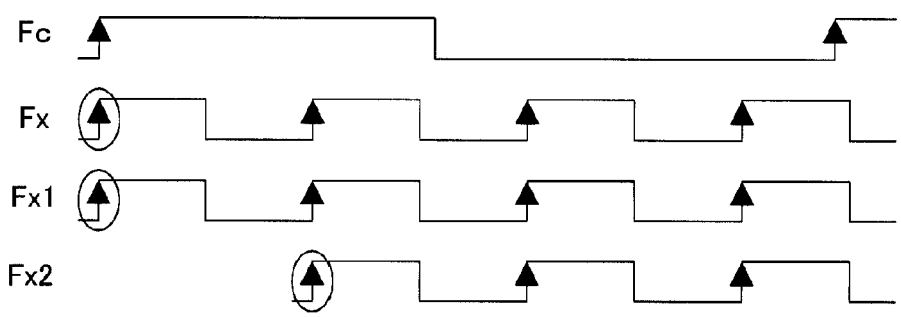
FIG. 25 is a timing chart of the idle tone dispersion device when two cycles of the measured signal is D, and a delay in which D is equally divided into two is applied.

In addition, FIG. 25 illustrates an example in which 2 cycles of the measured signal Fx is equally divided into two. In this case, the rising edges of the output measured signal Fx1 and the output measured signal Fx2 concurrently occur after the 2-nd cycle of the measured signal Fx. That is, the phase between FDSM (1) and FDSM (2) is not shifted, and thus, similar to an example of FIG. 6, the phase relationship of the idle tone is not dispersed, and the suppress effect of the idling tone is not obtained.

Thus, when the delay is performed such that D is divided into n, the dispersion effect of the idle tone gradually decreases when D is shifted from Tx, and the dispersion effect of the idle tone is not obtained when the amount of delay is identical to Tx. However, even when D is slightly shifted from Tx, and the amount of delay is Tx/n+Δ, the phase of the idle tone which is overlapped with the output data OUT1 to OUTn is able to be dispersed compared to a case where the amount of delay is identical to Tx, and thus the quantization noise of the frequency delta-sigma modulation signal Y is able to be suppressed. Accordingly, it is not necessary that the amount of delay is necessarily identical to Tx/n.

3-2: General Condition in Which Dispersion of Phase of Idle Tone is Not Biased

Next, a general condition in which the dispersion of the phase of the idle tone is not biased will be considered. A case in which, when the delay is performed such that the reference amount D is equally divided into n, the dispersion of the phase relationship of the idle tone is biased will be described with reference to a general relationship between D and n. When A and B are real numbers, an operator such as MODy in which B is basis is defined by the following expression.

$A \text{ MOD } \phi B = A - kB$ ($k$ is a maximum integer among integers satisfying $A \geq kB$)

In this case, a relative phase difference ($\phi i$ of the measured signal Fx with respect to the i-th output measured signal Fxi of n parallel FDSMs is denoted by the following Expression 1.

$\phi_{i+1} = (\phi_i + D/n) \text{MOD } \phi T$ (Expression 1)

Here, T is the one cycle of the measured signal Fx or the reference signal Fc, and $\phi_1$ is 0.

When a time difference between the rising edge of the output measured signal Fxi+1 supplied to i+1-th FDSM (i+1) and the rising edge of the output measured signal Fxi supplied to i-th FDSM (i) is D/n, D/n is a delay time of the delay circuit. For example, when the phase adjustment unit 10 has the configuration illustrated in FIG. 7B, D/n is each delay time of the delay circuits DLx1 to DLxn−1.

Figure 26:
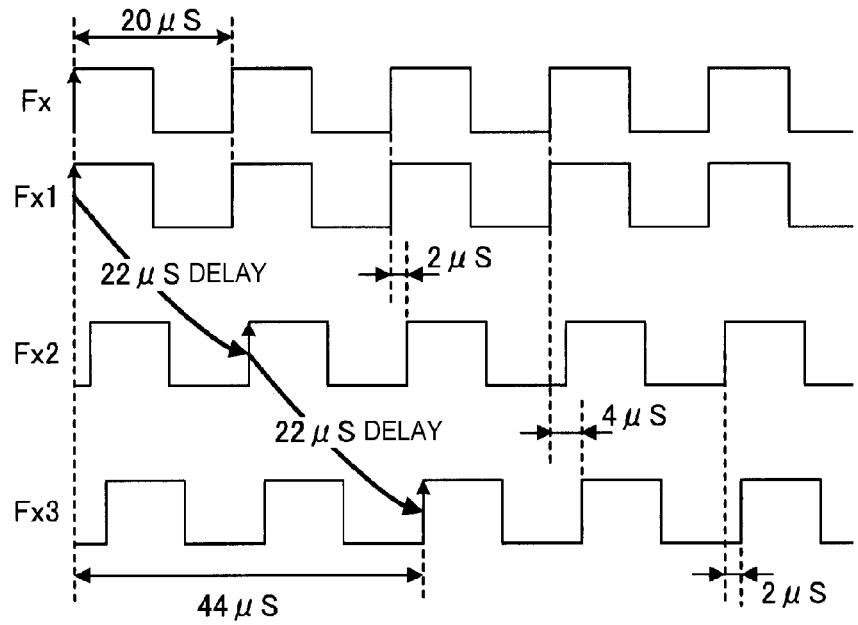
FIG. 26 is a timing chart for illustrating Expression 1.

On the other hand, the phase difference ($\phi i$ is a relative phase difference of the measured signal Fx with respect to the output measured signal Fxi. For this reason, when D/n is aT+X (a is an integer greater than or equal to 0, and X is 0<X<T), "$\phi_{i+1} - \phi_i$" is "X". For example, when the one cycle T of the measured signal Fx is 20 μS, and D/n is 22 μS, as illustrated in FIG. 26, the output measured signal Fx1 is identical to the measured signal Fx (no delay, $\phi_1$=0), the output measured signal Fx2 is obtained by delaying the measured signal Fx by 22 μS, and the output measured signal Fx3 is obtained by further delaying the output measured signal Fx1 by 22 μS.

Here, the output measured signal Fx2 is obtained by delaying the measured signal Fx by 22 μS, and the phase difference $\phi$2 is 2 μS. For this reason, $\phi$2+D/n is 24 μS, and ($\phi$2+D/n) MOD $\phi$T is 24 μS MOD $\phi$20 μS=4 μS=a phase difference $\phi$3.

On the other hand, when $y_i$ is a non-negative integer, b and M are natural numbers, and (mod M) is an operator assigning a remainder obtained by being divided by M, it is known that when b and M have a common divisor greater than or equal to 2, a cycle of a sequence $y_i$ denoted by the following Expression 2 is shorter than M from properties of a linear congruent method which is known as a pseudo random number generation algorithm.

$y_{i+1} = (y_i + b) \text{mod } M$ (Expression 2)

For example, when b is 9, and M is 6, the common divisor of b and M is 3, and thus b and M have the common divisor greater than or equal to 2. In this case, the sequence $y_j$ is "0, 3, 0, 3, 0, 3 . . . " and the cycle thereof is 2 (<M=6).

Here, when $y_0$ is a non-negative real number, $y_i$ is also a non-negative real number, and the cycle is not changed by a difference between initial values. Accordingly, even when $y_0$ is expanded at the time of being a non-negative real number, the cycle is shorter than M only when b and M have the common divisor greater than or equal to 2.

In addition, even when properties of sequence $n\phi_i/T$ which is n/T times of the sequence $\phi_i$ are considered instead of the sequence $\phi_i$, the cycle of the sequence is maintained. In addition, a part of a basis T of MOD $\phi T$ included in Expression 1 is able to be substituted by a natural number, and MOD $\phi$ is able to be substituted by mod. That is, both members of Expression 1 are multiplied by n/T, and thus Expression 1 is able to be converted into the following Expression 3.

$n\phi_{i+1}/T = (n\phi_i/T + D/T) \text{mod } n$ (Expression 3)

The cycle of the sequence $n\phi_i/T$ assigned by Expression 3 and the cycle of the sequence $\phi_i$ assigned by Expression 1 are not changed.

When D/T is an integer, and D/T and n have a common divisor greater than or equal to 2 in the sequence $n\phi_i/T$ assigned by Expression 3, the cycle of the sequence $n\phi_i/T$ (identical to the cycle of the sequence $\phi_i$) is shorter than n by properties of the linear congruent method. n is a parallel number of FDSM, and thus when the cycle of the sequence $\phi_i$ is shorter than n, there are output measured signals having the same phase difference with respect to the measured signal Fx among the output measured signals Fx1 to Fxn supplied to n parallel FDSM (1) to FDSM (n). In this case, the dispersion of the phase relationship of the idle tone is biased.

Accordingly, even when D/T is an integer, it is preferable that D and n are selected such that D/T and n are coprime integers. In addition, generally, even when mD/nT is an integer, it is preferable that D and n are selected such that mD/nT and m (m is a natural number less than or equal to n) are coprime integers. This is because when mD/nT is an integer, and mD/nT and m are not coprime integers, a cycle which is circulated m/g times occurs in the dispersion of the phase relationship of the idle tone when the greatest common factor between mD/nT and m is g.

In the above description, the output measured signals Fx1 to Fxn are generated by sequentially delaying the measured signal Fx by D/n, and the reference signal Fc is output as the output reference signals Fc1 to Fcn, the output reference signals Fc1 to Fcn may be generated by sequentially delaying the reference signal Fc by D/n, and the measured signal Fx may be output as the output measured signals Fx1 to Fxn. That is, the phase adjustment unit 10 supplies one signal between the measured signal Fx and the reference signal Fc to n FDSM (1) to FDSM (n), the other signal between the measured signal Fx and the reference signal Fc is delayed by using a plurality of delay circuits and is supplied to n FDSM (1) to FDSM (n).

Further, the measured signal Fx and the reference signal Fc may be delayed, and the output measured signals Fx1 to Fxn and the output reference signals Fc1 to Fcn may be generated. That is, when the phase difference between the output measured signal Fxi and the output reference signal Fci is Pi, the phase adjustment unit 10 may relatively adjust the phase between the measured signal Fx and the reference signal Fc such that D/n=Pi+1−Pi, and may generate the output measured signals Fx1 to Fxn and the output reference signals Fc1 to Fcn.

Even when any one cycle of the measured signal Fx and the reference signal Fc is substituted into T, it is preferable that D and n are selected such that mD/nT and m are coprime integers when mD/nT is an integer, but in the first embodiment and the second embodiment described above, it is automatically satisfied by selecting D to be identical to the one cycle of the signal having the higher frequency of the frequency of the measured signal Fx and the frequency of the reference signal Fc, and performing the delay such that D is divided into n.

3-3: Comparison between Frequencies of Measured Signal and Reference Signal

In the first embodiment and the second embodiment described above, when the shorter cycle between the one cycle of the measured signal Fx (in the second embodiment, the half cycle) and the one cycle of the reference signal Fc is Tx, and the phase difference between the output measured signal Fxi and the output reference signal Fci supplied to i-th FDSM (i) is Pi, the phase adjustment unit 10 generates the n sets of output measured signals and output reference signals (Fx1, Fc1), (Fx2, Fc2), . . . , and (Fxn, Fcn) such that Tx/n=Pi+1−Pi. When a rough frequency of the signal Fx which is measured in advance and the frequency of the reference signal Fc are known, it is possible to determine a delay time of the delay circuit configuring the phase adjustment unit 10 in advance. However, when the frequencies of the measured signal Fx and the reference signal Fc are unknown, it is not possible to determine the delay time.

Figure 27:
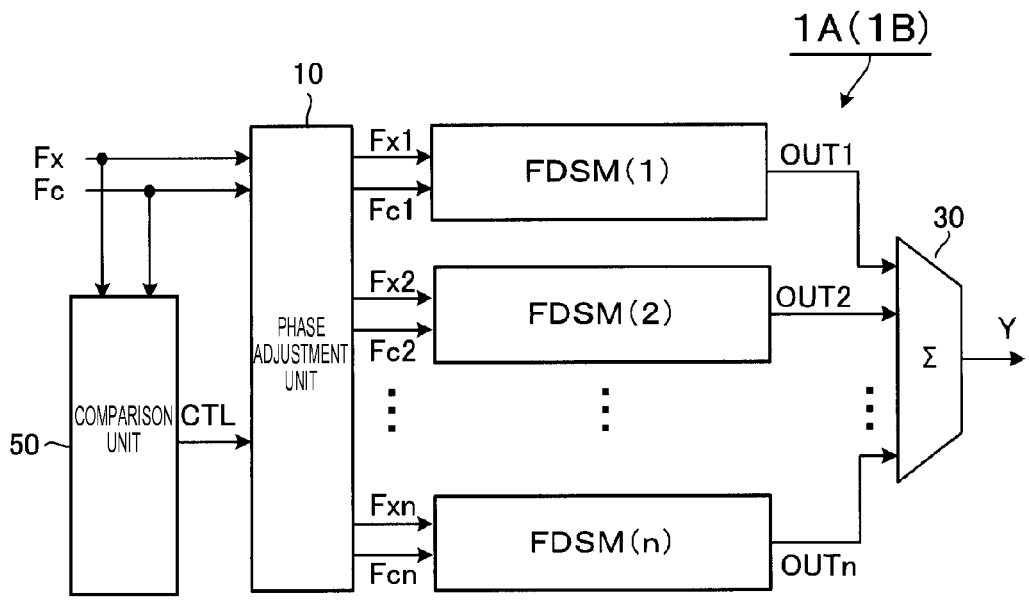
FIG. 27 is a block diagram of the idle tone dispersion device including a comparison unit.

Therefore, the idle tone dispersion device 1A (1B) of the first embodiment (the second embodiment) described above is illustrated in FIG. 27. As illustrated in the same drawing, the idle tone dispersion device 1A (1B) includes a comparison unit 50. The comparison unit 50 compares the frequency fx of the measured signal Fx with the frequency fc of the reference signal Fc, and generates a control signal CTL indicating a comparison result. The phase adjustment unit 10 relatively adjusts the phase between the measured signal Fx and the reference signal Fc on the basis of the control signal CTL, and generates the n sets of output measured signals and output reference signals (Fx1, Fc1), (Fx2, Fc2), . . . , and (Fxn, Fcn).

More specifically, when FDSM (1) to FDSM (n) generate the output data OUT1 to OUTn in a data stream format as described in the first embodiment, the comparison unit 50 generates the control signal CTL indicating the higher frequency (the lower frequency) between the frequency fx and the frequency fc. In contrast, when FDSM (1) to FDSM (n) generate output data OUT1 to OUTn in a bit stream format as described in the second embodiment, the comparison unit 50 generates the control signal CTL indicating the higher frequency (the lower frequency) between the frequency 2fx and the frequency fc.

The phase adjustment unit 10 controls the delay time of the delay circuit on the basis of the control signal CTL. For example, an output signal of a quartz crystal oscillator is assumed in which the frequency fc of the reference signal Fc is 5 MHz (one cycle is 200 nS), and the frequency fx of the measured signal Fx is 100 kHz (one cycle is 50 nS) and 20 MHz (one cycle is 50 nS). When the output data OUT1 to OUTn is in a data stream format, the phase adjustment unit 10 controls the delay time of the delay circuit such that the delay time of the delay circuit is 200 nS/n at the time of fx=100 kHz, and controls the delay time of the delay circuit such that the delay time of the delay circuit is 50 nS/n at the time of fx=20 MHz. In contrast, when the output data OUT1 to OUTn is in a bit stream format, the phase adjustment unit 10 controls the delay time of the delay circuit such that the delay time of the delay circuit is 200 nS/n at the time of fx=100 kHz, and controls the delay time of the delay circuit such that the delay time of the delay circuit is 25 nS/n at the time of fx=20 MHz.

Thus, by controlling the phase adjustment unit 10 using the comparison unit 50, it is possible to enlarge a frequency range of the measured signal Fx which is supplied to the idle tone dispersion device 1A (1B).

4. Examples

The effect of the idle tone dispersion device 1B of the second embodiment described above is remarkable when a parallel number is "100", "1000", and the like. In an example, the frequency delta-sigma modulation signal Y is subjected to an FFT analysis by setting n=100 using the idle tone dispersion device 1B illustrated in FIG. 15.

Next, in Comparative Example 1, output data of one FDSM is subjected to the FFT analysis. In addition, in Dag T Wisland, et al., ESSCIRC2002, pp. 687-690, 2002, a configuration is disclosed in which the measured signal Fx is delayed such that the half cycle of the measured signal Fx is equally divided into n, and n FDSMs are parallelized. This is set to Comparative Example 2, and the frequency delta-sigma modulation signal Y is subjected to the FFT analysis.

As the measured signal Fx, a signal modulated by a center frequency of 80 kHz of carrier waves, a modulation frequency of 30 kHz, and a modulation width ±5 kHz is generated by a frequency synthesizer, and the reference signal Fc having a frequency of 2 MHz is prepared.

In the example, the frequency (2 MHz) of the reference signal Fc is higher than a frequency (160 kHz) two times of the center frequency of the measured signal Fx, and thus the measured signal Fx is delayed such that $1/2e^{+6}$ S which is the one cycle of the reference signal Fc is equally divided into 100. In contrast, in Comparative Example 2, the measured signal Fx is delayed such that $1/160e^{+3}$ S which is a half cycle of the center frequency of the measured signal Fx is equally divided into 100.

Figure 28:
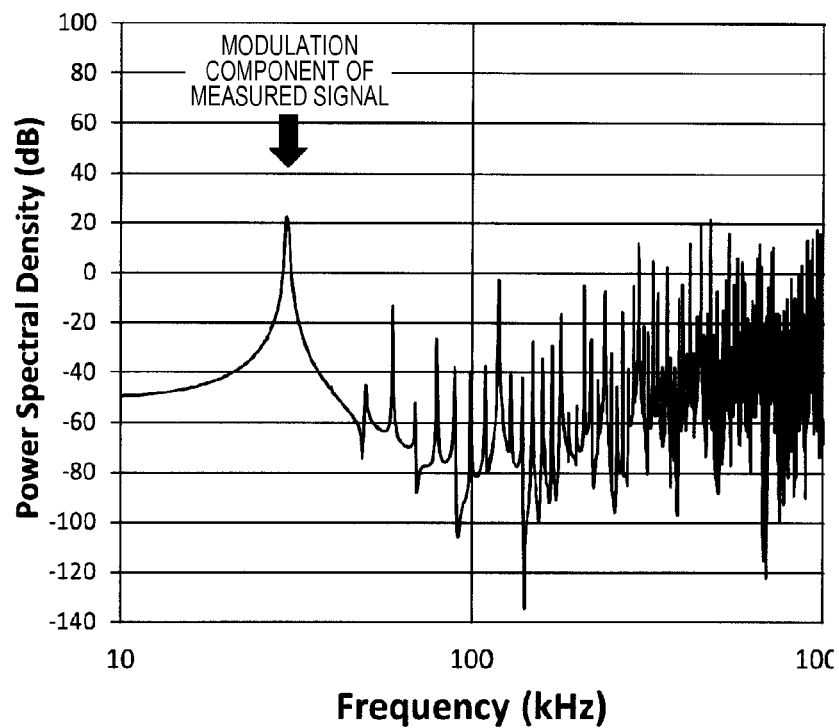
FIG. 28 is a graph illustrating an FFT analysis result of an example.
Figure 29:
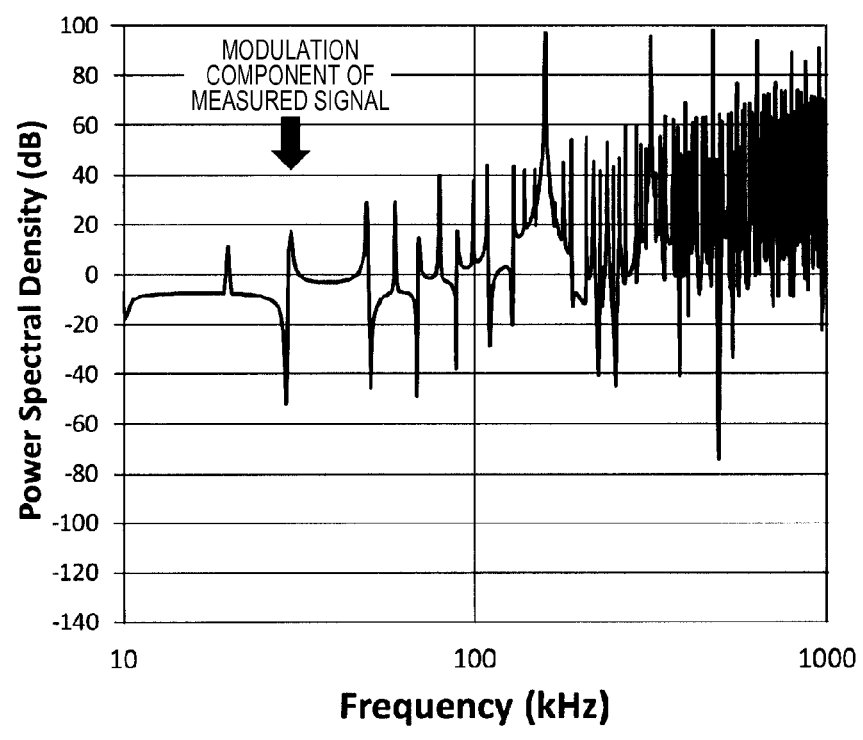
FIG. 29 is a graph illustrating an FFT analysis result of Comparative Example 1.
Figure 30:
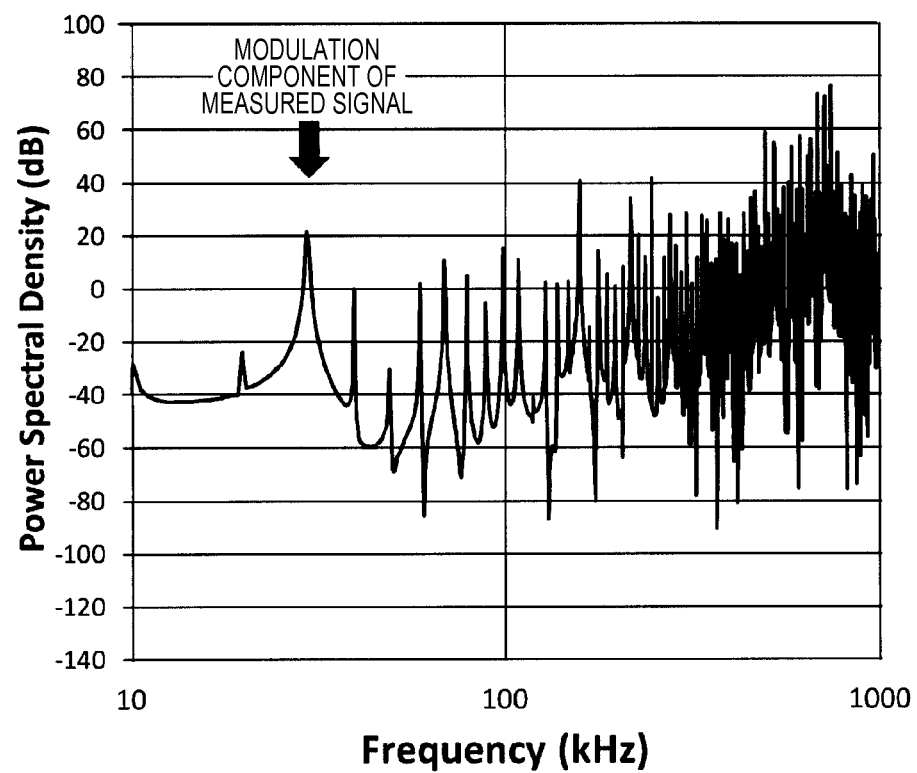
FIG. 30 is a graph illustrating an FFT analysis result of Comparative Example 2.

An FFT analysis result of the example is illustrated in FIG. 28, an FFT analysis result of Comparative Example 1 is illustrated in FIG. 29, and an FFT analysis result of Comparative Example 2 is illustrated in FIG. 30. In the example, a peak component due to the idle tone (the quantization error) is suppressed, and SNR is improved by approximately 20 dB to 40 dB compared to Comparative Example 2 corresponding to the configuration of Dag T Wisland, et al., ESSCIRC2002, pp. 687-690, 2002, which is illustrated in FIG. 30.

It is described that, when n parallel FDSM (1) to FDSM (n) corresponding to a bit stream are considered in which the one cycle of the signal having the higher frequency (the shorter cycle) between the double frequency 2fx of the measured signal Fx and the frequency of the reference signal Fc is t, the reference amount is D, and the delay is performed such that D is divided into n, in design, it is preferable that D and n are selected such that D/T and n are coprime integers, in general, mD/nT and m (m is a natural number less than or equal to n) are coprime integers even when D/T is an integer.

Here, in 100 parallel FDSMs according to the configuration of the invention, and 100 parallel FDSMs according to the configuration of Dag T Wisland, et al., ESSCIRC2002, pp. 687-690, 2002, a relationship between D/T and n will be considered. n is n=100. T is a value identical to the one cycle of the reference signal Fc or the half cycle of the measured signal Fx. The measured signal Fx is a modulation signal, and thus has a width in a frequency ($T=1/2e^{+6}$, $1/170e^{+3}$ to $1/150e^{+3}$).

D of 100 parallel FDSMs according to the configuration of the invention is set such that $D=1/2e^{+6}$, and thus a case where D/T is an integer is not limited to when T is $1/2e^{+6}$, D/T is 1 at the time of $T=1/2e^{+6}$, and D/T and n have the common divisor greater than or equal to 2, and thus the relative phase relationship of the idle tone is efficiently dispersed.

Figure 31:
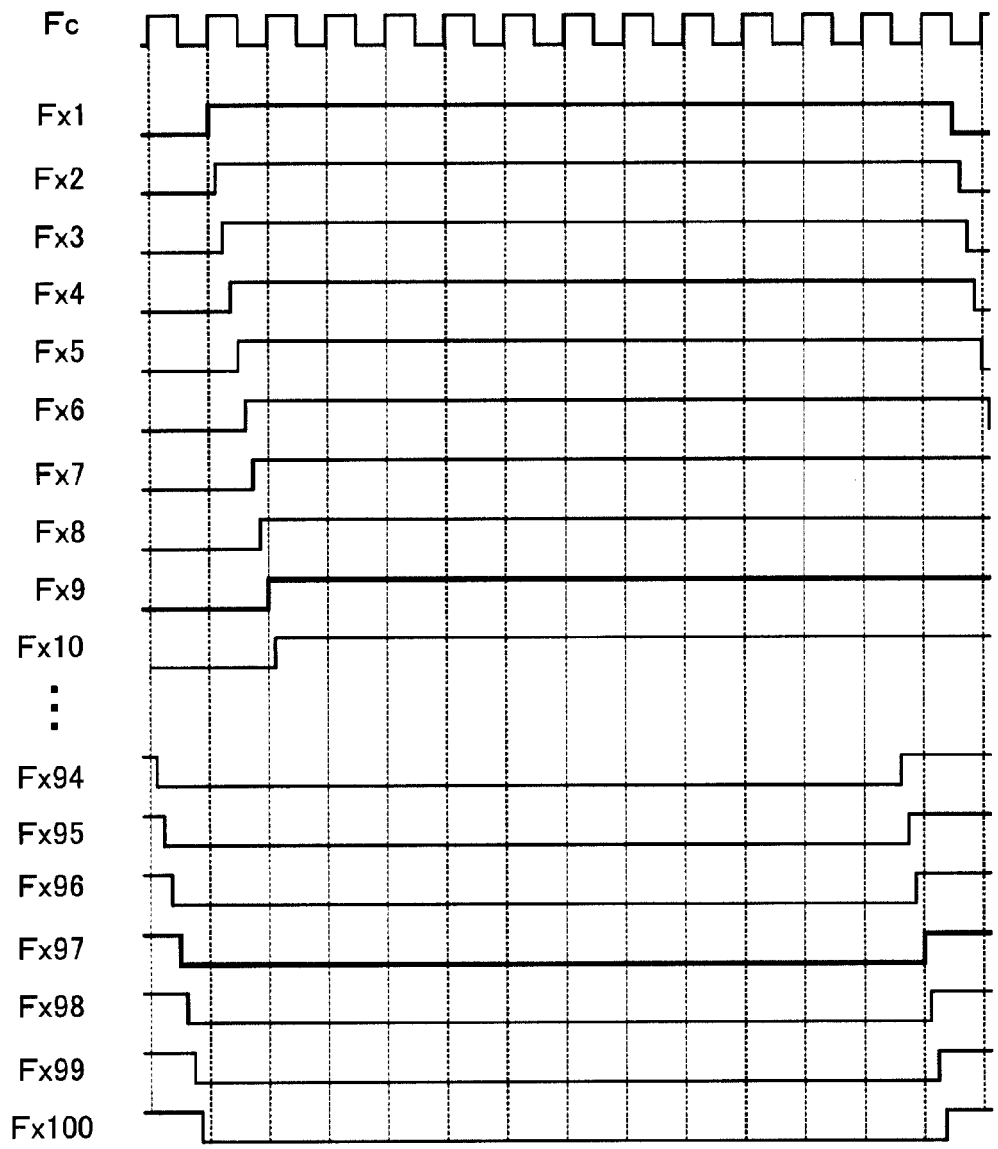
FIG. 31 is a timing chart of Comparative Example 2.

In contrast, D of 100 parallel FDSMs according to the configuration of Dag T Wisland, et al., ESSCIRC2002, pp. 687-690, 2002 is $D=1/160e^{+3}$. When T is $1/2e^{+6}$, $D/T=2e^{+6}/160e^{+3}=12.5$ which is not an integer, and when m is 96, mD/nT is 12, and thus 12 and 96 have the common divisors of 2, 3, 4, 6, and 12. The greatest common factor is 12, and thus cyclic properties circulating in 96/12=8-th parallel FDSM occur in the dispersion of the relative phase relationship of the idle tone, and the relative phase relationship of the idle tone between the outputs of 100 parallel FDSMs is not efficiently dispersed. In FIG. 31, the phase relationship between the measured signal Fx and the reference signal Fc at this time is illustrated by a timing chart. The occurrence of the cycle circulating in 8-th parallel FDSM is known from a relationship of output reference signals Fx1, Fx9, and Fx97 which are shown by a bold character or a bold line. In addition, 96 of m=96 corresponds to a fact that the final 12-th cycle (obtained by 96÷8=12) of the cycle circulating in 8-th parallel FDSM is a output measured signal Fx96. As described above, a dispersion difference in the relative phase relationship of the idling tone between the configuration of the invention and the configuration of Dag T Wisland, et al., ESSCIRC2002, pp. 687-690, 2002 is a difference in an improvement degree of SNR.

5. Application Example

Next, a frequency measurement device to which the idle tone dispersion device described in the first to the third embodiments and the example described above is applied will be described.

Figure 32:
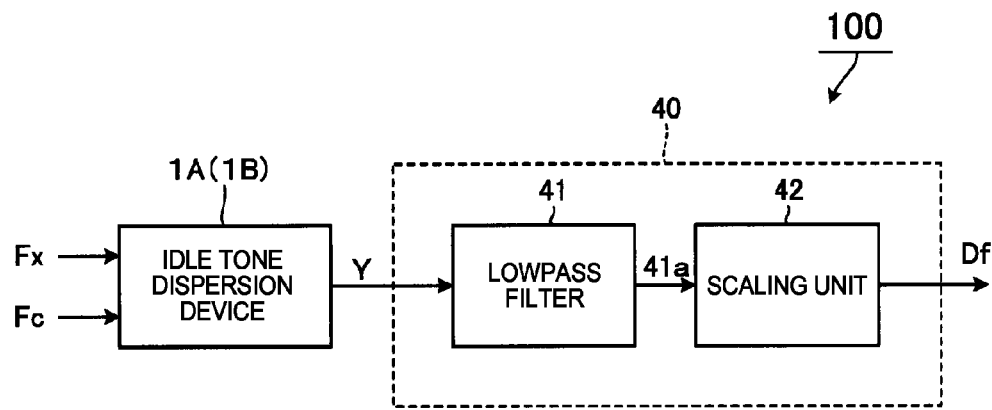
FIG. 32 is a block diagram of a frequency measurement device according to an application example.

In FIG. 32, a block diagram of a frequency measurement device 100 is illustrated. As illustrated in this drawing, the frequency measurement device 100 includes the idle tone dispersion device 1A (1B), and a frequency data generating unit 40. The frequency data generating unit 40 generates frequency data Df indicating the frequency measured signal Fx on the basis of the frequency delta-sigma modulation signal Y.

When the frequency delta-sigma modulation signal Y is an output from the idle tone dispersion device 1A corresponding to a data stream described in the first embodiment, the frequency delta-sigma modulation signal Y outputs a ratio (fx/fc) of the frequency fx of the measured signal Fx and the frequency fc of the reference signal Fc in a format including a quantization error over time as a digital signal array. On the other hand, when the frequency delta-sigma modulation signal Y is an output from the idle tone dispersion device 1B corresponding to a bit stream described in the second embodiment, the frequency delta-sigma modulation signal Y outputs a ratio (2fx/fc) of the double frequency 2fx of the measured signal Fx and the frequency fc of the reference signal Fc in a format including a quantization error over time as a digital signal array.

For this reason, the frequency data generating unit 40 includes a lowpass filter 41, and a scaling unit 42 which generates the frequency data Df by scaling the output of the lowpass filter. In frequency measurement, a time resolution and a frequency resolution are determined according to properties of the lowpass filter 41. As the lowpass filter 41, for example, a 3-stage movable average filter is able to be used in which three movable average filters simply averaging the nearest 10 samples are arranged. The scaling unit 42 generates the frequency data Df by multiplying output data 41a of the lowpass filter 41 and a correction coefficient. For example, the idle tone dispersion device 1B corresponding to a bit stream is disposed on a former stage of the frequency data generating unit 40, and when the frequency fx of the measured signal Fx is 1 MHz, and the frequency fc of the reference signal Fc is 2 MHz, 2fx/fc=1. In addition, the frequency delta-sigma modulation signal Y is proportionate to the frequency fx of the measured signal Fx, and thus the correction coefficient may be 1 M.

Next, an example and a comparative example of the frequency measurement device 100 will be described. As the measured signal Fx, frequency modulation waves which are modulated by a center frequency of 80 kHz of carrier waves, a modulation frequency of 30 kHz, and a modulation width of ±5 kHz are generated by a frequency synthesizer, and the reference signal Fc having a frequency fc of 2 MHz is prepared.

First, by using the idle tone dispersion device 1B corresponding to a bit stream, the frequency measurement device 100 of the example sets a parallel number n to 100, generates output measured signals Fx1 to Fx100 in which measured signal Fx is sequentially delayed such that $1/2e^{+6}$ S which is the one cycle of the reference signal Fc is equally divided into 100, and supplies the output measured signals to FDSM (1) to FDSM (100).

Next, in the frequency measurement device of the comparative example, 100 FDSMs described in Dag T Wisland, et al., ESSCIRC2002, pp. 687-690, 2002 are parallelized, and the frequency measurement device sequentially delays the measured signal Fx such that $1/160e^{+3}$ S which is the half cycle of the center frequency of the measured signal Fx is equally divided into 100, and supplies the delayed measured signal to 100 parallelized FDSM.

Figure 33:
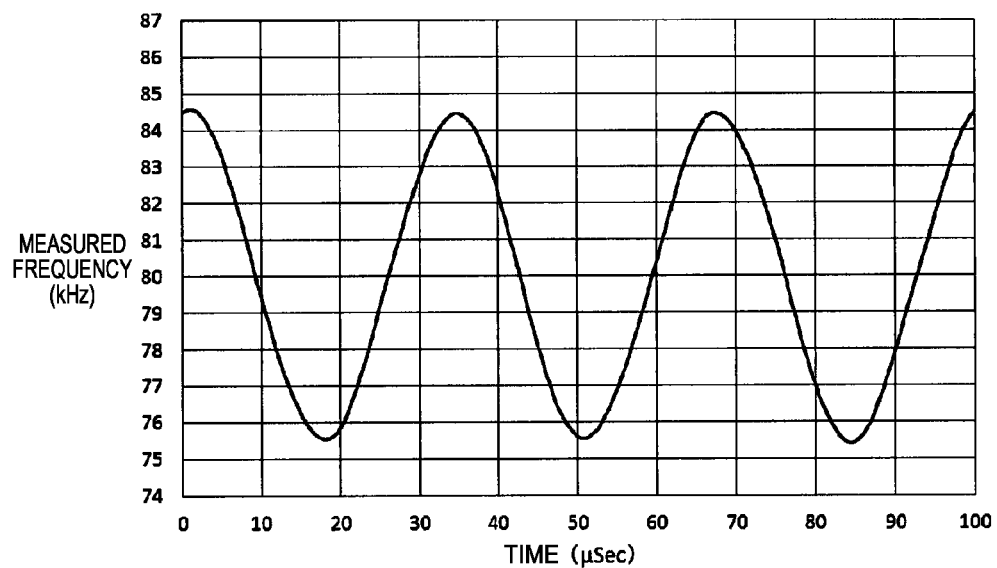
FIG. 33 is a graph illustrating a frequency measurement result of an example.
Figure 34:
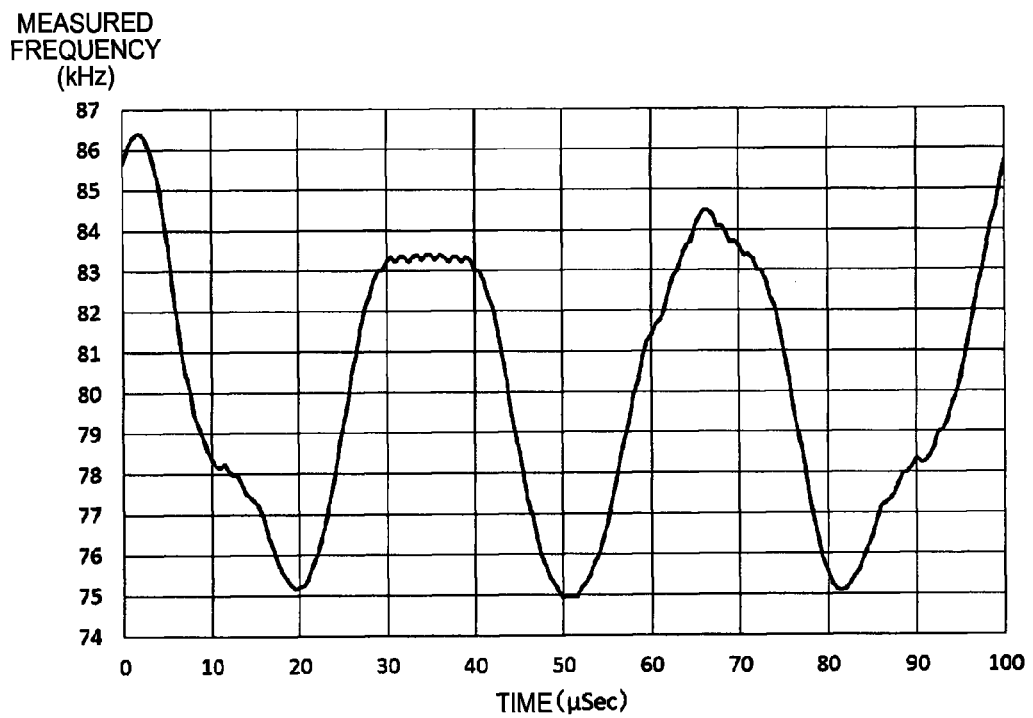
FIG. 34 is a graph illustrating a frequency measurement result of a comparative example.

A frequency measurement result of the example is illustrated in FIG. 33, and a frequency measurement result of the comparative example is illustrated in FIG. 34. In the example, a fact that SNR is improved compared to the comparative example is confirmed as a real time frequency measurement result.

The entire disclosure of Japanese Patent Application No. 2014-101818 filed May 15, 2014 is expressly incorporated by reference herein.

What is claimed is:

1. An idle tone dispersion device which performs a frequency delta-sigma modulation with respect to a measured signal by using a reference signal and outputs a frequency delta-sigma modulation signal having an idle tone dispersed therein, the idle tone dispersion device comprising:
   n frequency delta-sigma modulators;
   a phase adjuster configured to relatively adjust a phase between the measured signal and the reference signal, to generate n sets of output measured signals and output reference signals, and to supply each set of output measured signals and output reference signals to each of the n frequency delta-sigma modulators; and an adder configured to add an output signal of the n frequency delta-sigma modulators and outputs the frequency delta-sigma modulation signal, wherein n is a natural number greater than or equal to 2, each of the n frequency delta-sigma modulators performs the frequency delta-sigma modulation with respect to the output measured signal by using the output reference signal supplied from the phase adjuster, and the phase adjuster relatively adjusts the phase between the measured signal and the reference signal such that an entire phase of the idle tone is different from the output signal of the n frequency delta-sigma modulators, and generates the n sets of output measured signals and output reference signals.

2. The idle tone dispersion device according to claim 1, wherein, when a predetermined time is D, one cycle of the measured signal or one cycle of the reference signal is T, m is a natural number less than or equal to n, mD/nT is an integer, mD/nT and m are coprime integers, and a phase difference between the output measured signal and the output reference signal supplied to an i-th one of the frequency delta-sigma modulators is Pi, the phase adjuster relatively adjusts the phase between the measured signal and the reference signal such that D/n=Pi+1−Pi, and generates the n sets of output measured signals and output reference signals, wherein i is a natural number less than or equal to n−1.

3. The idle tone dispersion device according to claim 1, wherein the frequency delta-sigma modulators output the output signal in a data stream format, and when a shorter cycle between one cycle of the measured signal and one cycle of the reference signal is Tx, and a phase difference between the output measured signal and the output reference signal supplied to an i-th one of the frequency delta-sigma modulators is Pi, the phase adjuster relatively adjusts the phase between the measured signal and the reference signal such that Tx/n=Pi+1−Pi, and generates the n sets of output measured signals and output reference signals, wherein i is a natural number less than or equal to n−1.

4. The idle tone dispersion device according to claim 1, wherein the frequency delta-sigma modulators output the output signal in a bit stream format, and when a shorter cycle between a half cycle of the measured signal and one cycle of the reference signal is Tx, and a phase difference between the output measured signal and the output reference signal supplied to an i-th one of the frequency delta-sigma modulators is Pi, the phase adjuster relatively adjusts the phase between the measured signal and the reference signal such that Tx/n=Pi+1−Pi, and generates the n sets of output measured signals and output reference signals, wherein i is a natural number less than or equal to n−1.

5. The idle tone dispersion device according to claim 3, wherein the phase adjuster includes a plurality of delay circuits connected in series, each of the delay circuits having a delay time of Tx/n, and one signal between the measured signal and the reference signal is supplied to the n frequency delta-sigma modulators, and the other signal between the measured signal and the reference signal is delayed by using the plurality of delay circuits and then is supplied to the n frequency delta-sigma modulators.

6. The idle tone dispersion device according to claim 3, further comprising:

a comparator configured to compare a frequency of the measured signal with a frequency of the reference signal, wherein the phase adjuster relatively adjusts the phase between the measured signal and the reference signal based on a comparison result of the comparator, and generates the n sets of output measured signals and output reference signals.

7. A frequency measurement device, comprising:

an idle tone dispersion device which performs a frequency delta-sigma modulation with respect to a measured signal by using a reference signal and outputs a frequency delta-sigma modulation signal having an idle tone dispersed therein, the idle tone dispersion device including:

n frequency delta-sigma modulators;

a phase adjuster configured to relatively adjust a phase between the measured signal and the reference signal, to generate n sets of output measured signals and output reference signals, and to supply each set of output measured signals and output reference signals to each of the n frequency delta-sigma modulators; and an adder configured to add an output signal of the n frequency delta-sigma modulators and outputs the frequency delta-sigma modulation signal, wherein n is a natural number greater than or equal to 2, each of the n frequency delta-sigma modulators performs the frequency delta-sigma modulation with respect to the output measured signal by using the output reference signal supplied from the phase adjuster, and the phase adjuster relatively adjusts the phase between the measured signal and the reference signal such that an entire phase of the idle tone is different from the output signal of the n frequency delta-sigma modulators, and generates the n sets of output measured signals and output reference signals; and a frequency data generator configured to generate frequency data indicating a frequency of a measured signal based on a frequency delta-sigma modulation signal.

8. A method of performing frequency delta-sigma modulation with respect to a measured signal by using a reference signal and outputting a frequency delta-sigma modulation signal having an idle tone dispersed therein, the method comprising:

relatively adjusting a phase between the measured signal and the reference signal;

generating n sets of output measured signals and output reference signals;

supplying each set of output measured signals and output reference signals to each of n frequency delta-sigma modulators;

adding an output signal of the n frequency delta-sigma modulators;

outputting the frequency delta-sigma modulation signal, wherein n is a natural number greater than or equal to 2, each of the n frequency delta-sigma modulators performs the frequency delta-sigma modulation with respect to the output measured signal by using the output reference signal, and the phase between the measured signal and the reference signal is relatively adjusted such that an entire phase of the idle tone is different from the output signal of the n frequency delta-sigma modulators, and the n sets of output measured signals and output reference signals are generated.

9. The method according to claim 8,
wherein, when a predetermined time is D, one cycle of the measured signal or one cycle of the reference signal is T, m is a natural number less than or equal to n, mD/nT is an integer, mD/nT and m are coprime integers, and a phase difference between the output measured signal and the output reference signal supplied to an i-th one of the frequency delta-sigma modulators is Pi, the phase between the measured signal and the reference signal is relatively adjusted such that D/n=Pi+1−Pi, and the n sets of output measured signals and output reference signals are generated, wherein i is a natural number less than or equal to n−1.

10. The method according to claim 8,
wherein the frequency delta-sigma modulators output the output signal in a data stream format, and
when a shorter cycle between one cycle of the measured signal and one cycle of the reference signal is Tx, and a phase difference between the output measured signal and the output reference signal supplied to an i-th one of the frequency delta-sigma modulators is Pi, the phase between the measured signal and the reference signal is relatively adjusted such that Tx/n=Pi+1−Pi, and the n sets of output measured signals and output reference signals are generated, wherein i is a natural number less than or equal to n−1.

11. The method according to claim 8,
wherein the frequency delta-sigma modulators output the output signal in a bit stream format, and
when a shorter cycle between a half cycle of the measured signal and one cycle of the reference signal is Tx, and a phase difference between the output measured signal and the output reference signal supplied to an i-th one of the frequency delta-sigma modulators is Pi, the phase between the measured signal and the reference signal is relatively adjusted such that Tx/n=Pi+1−Pi, and the n sets of output measured signals and output reference signals are generated, wherein i is a natural number less than or equal to n−1.

12. The method according to claim 10,
one signal between the measured signal and the reference signal is supplied to the n frequency delta-sigma modulators, and the other signal between the measured signal and the reference signal is delayed by using a plurality of delay circuits each having a delay time of Tx/n and then is supplied to the n frequency delta-sigma modulators.

13. The method according to claim 10, further comprising:
comparing a frequency of the measured signal with a frequency of the reference signal,
wherein the phase between the measured signal and the reference signal is relatively adjusted based on the comparison, and the n sets of output measured signals and output reference signals are generated.

\* \* \* \* \*